(12) United States Patent
Abou-Khalil et al.

(10) Patent No.: US 8,299,544 B2
(45) Date of Patent: Oct. 30, 2012

(54) FIELD EFFECT TRANSISTOR HAVING OHMIC BODY CONTACT(S), AN INTEGRATED CIRCUIT STRUCTURE INCORPORATING STACKED FIELD EFFECT TRANSISTORS WITH SUCH OHMIC BODY CONTACTS AND ASSOCIATED METHODS

(75) Inventors: Michel J. Abou-Khalil, Essex Junction, VT (US); William F. Clark, Jr., Essex Junction, VT (US); Yun Shi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 12/983,925

(22) Filed: Jan. 4, 2011

(65) Prior Publication Data

US 2012/0168878 A1    Jul. 5, 2012

(51) Int. Cl.
*H01L 27/088* (2006.01)
(52) U.S. Cl. .................................. 257/401; 257/288
(58) Field of Classification Search .................. 257/288, 257/331, 327, 401, E21.444; 438/183, 142, 438/151, 197
See application file for complete search history.

(56) References Cited

U.S. PATENT DOCUMENTS

| | | | |
|---|---|---|---|
| 5,573,961 | A | 11/1996 | Hsu et al. |
| 6,320,225 | B1 | 11/2001 | Hargrove et al. |
| 6,960,810 | B2 | 11/2005 | Fechner |
| 7,005,705 | B2 | 2/2006 | Maeda et al. |
| 7,679,139 | B2 | 3/2010 | Larsen et al. |
| 7,732,287 | B2 | 6/2010 | Fechner et al. |

OTHER PUBLICATIONS

Matloubian, "Smart body contact for SOI MOSFETs," IEEE SOS/SOI Technology Conference, 1989, pp. 128-129.
Oh et al., "The effect of body contact arrangement on thin SOI MOSFET characteristics," Microelectronic Engineering, vol. 28, No. 1-4, Jun. 1995, pp. 467-470.
Hirano et al., "Impact of 0.10 μm SOI CMOS with body-tied hybrid trench isolation structure to break through the scaling crisis of silicon technology," IEDM 2000, pp. 467-470.
Min et al., "Partial trench isolated body-tied (PTIBT) structure for SOI applications," IEEE International SOI Conference, 2001, pp. 71-72.
Lam et al., "An Enhanced Compact Waffle MOSFET with Low Drain Capacitance From a Standard Submicron CMOS Technology," Department of Electrical and Electronic Engineering, Clear Water Bay, Kowloon, Hong Kong, May 3, 2002.

*Primary Examiner* — Tucker Wright
(74) *Attorney, Agent, or Firm* — Gibb & Riley, LLC; Michael J. LeStrange, Esq.

(57) ABSTRACT

Disclosed is a field effect transistor (FET), in which ohmic body contact(s) are placed relatively close to the active region. The FET includes a semiconductor layer, where the active region and body contact region(s) are defined by a trench isolation structure and where a body region is below and abuts the active region, the trench isolation structure and the body contact region(s). A gate traverses the active region. Dummy gate(s) are on the body contact region(s). A contact extends through each dummy gate to the body contact region below. Dielectric material isolates the contact(s) from the dummy gate(s). During processing, the dummy gate(s) act as blocks to ensure that the body contact regions are not implanted with source/drain dopants or source/drain extension dopants and, thereby to ensure that the body contacts, as formed, are ohmic. Also disclosed are an integrated circuit structure with stacked FETs, having such ohmic body contacts, and associated methods.

10 Claims, 20 Drawing Sheets

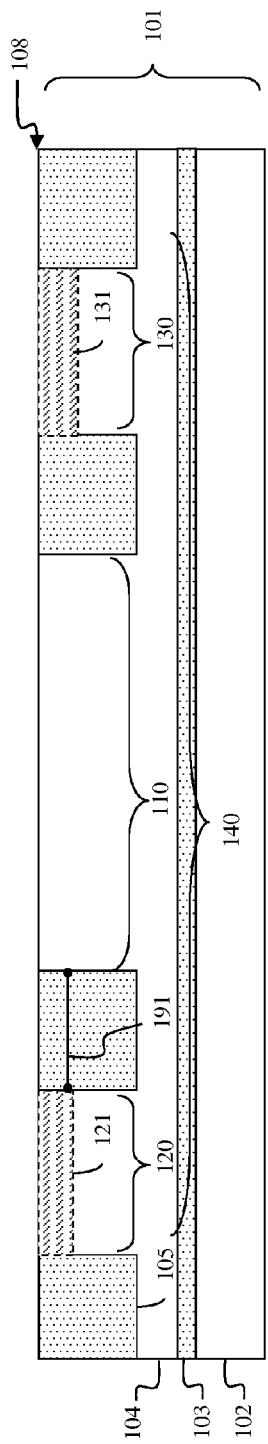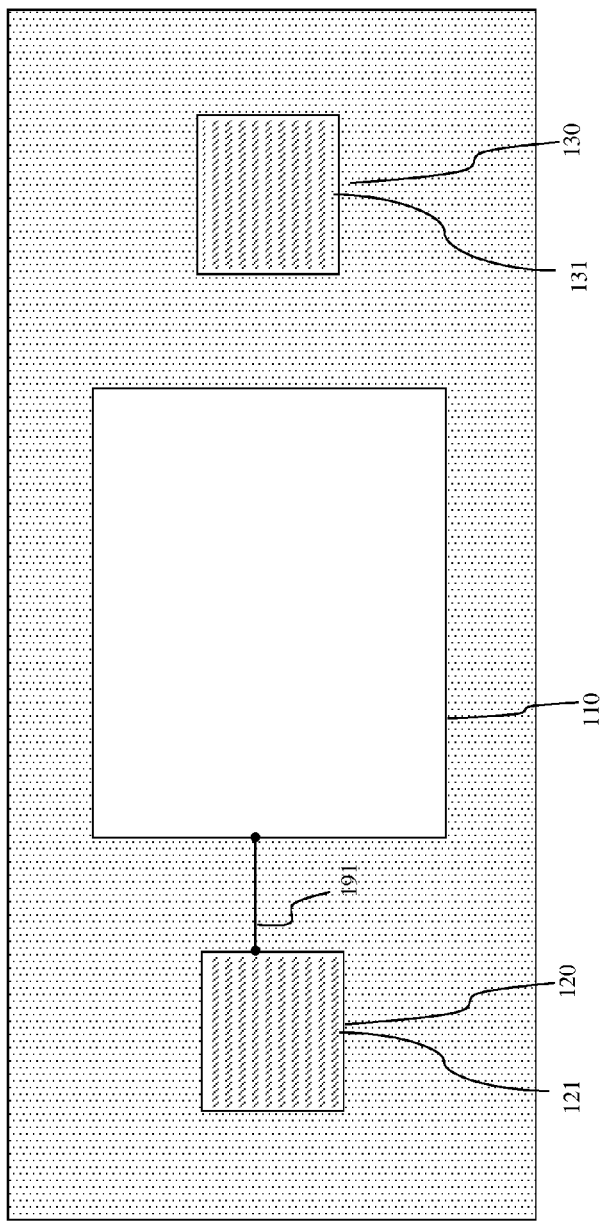
Figure 9A
Figure 9B

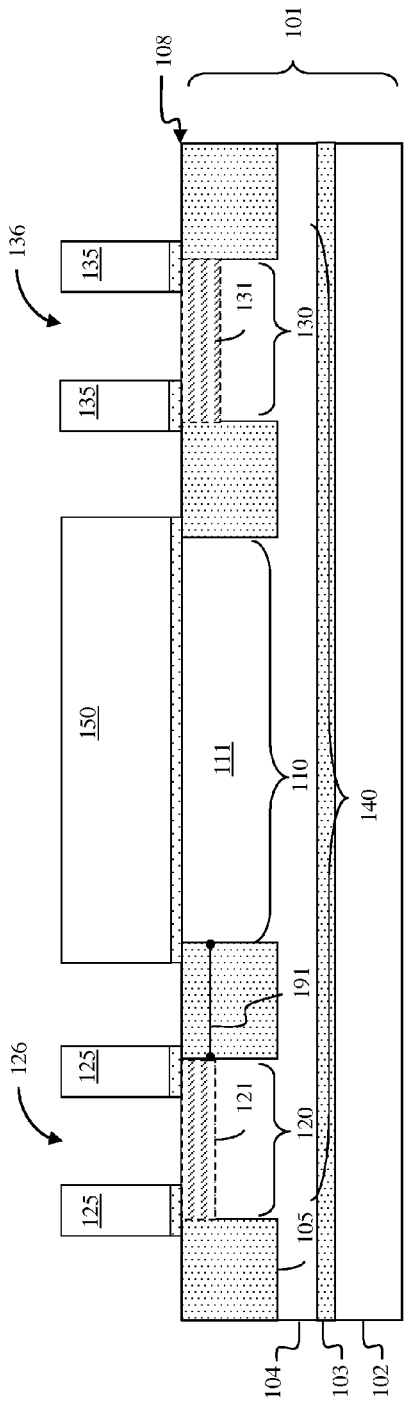
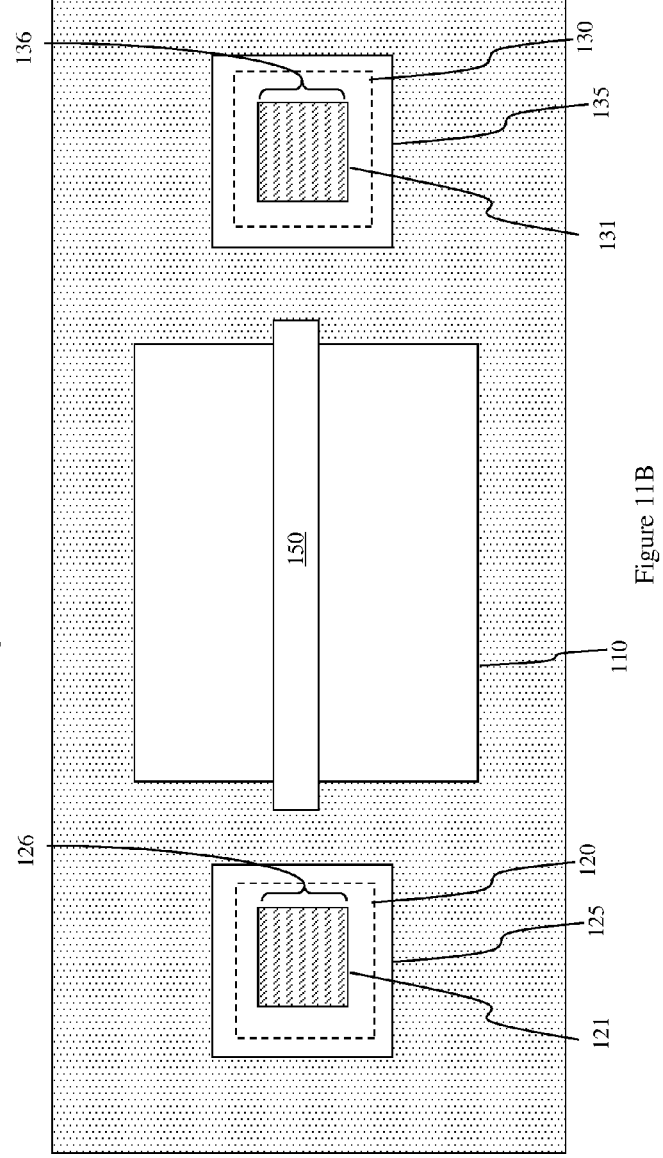
Figure 11A
Figure 11B

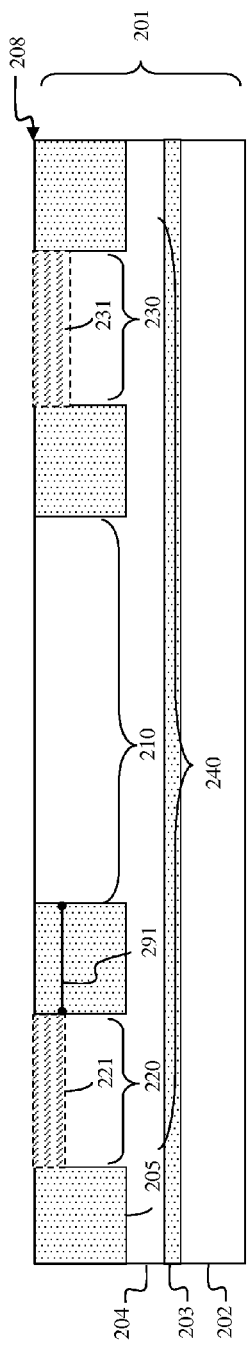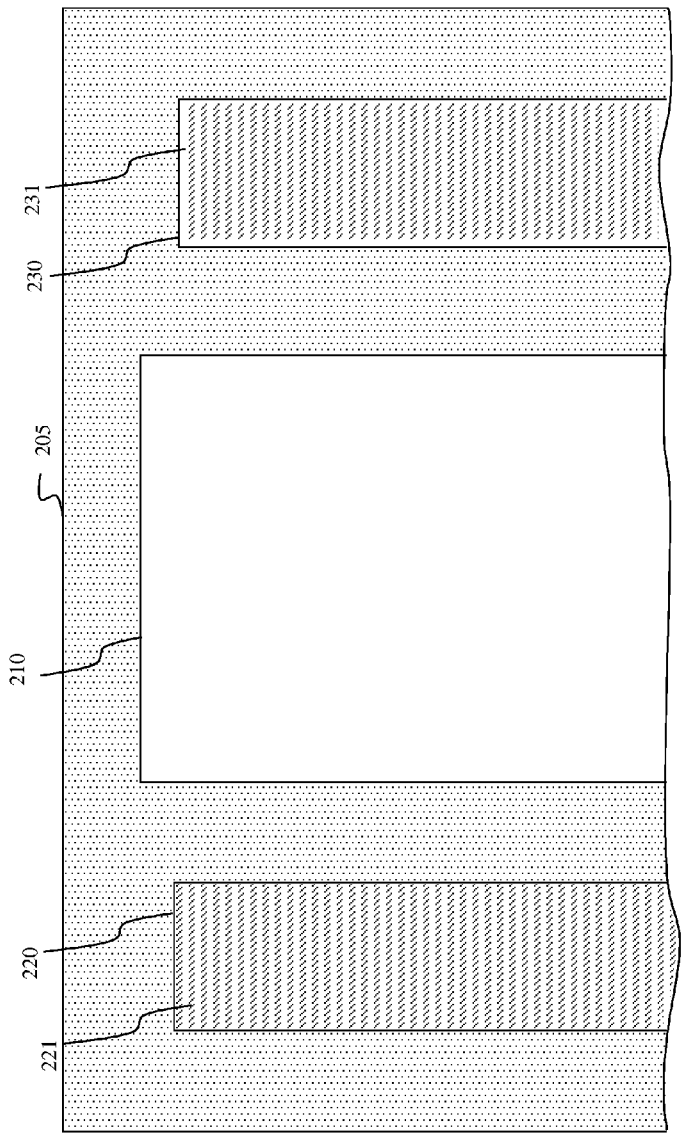

US 8,299,544 B2

FIELD EFFECT TRANSISTOR HAVING OHMIC BODY CONTACT(S), AN INTEGRATED CIRCUIT STRUCTURE INCORPORATING STACKED FIELD EFFECT TRANSISTORS WITH SUCH OHMIC BODY CONTACTS AND ASSOCIATED METHODS

BACKGROUND

1. Field of the Invention

The present invention relates to field effect transistors and, more particularly, to embodiments of a field effect transistor (FET) structure having one or more ohmic body contacts placed relatively close to the active region of the FET, to embodiments of an integrated circuit structure incorporating a plurality of stacked FETs with such ohmic body contacts and to method embodiments for forming these structures.

2. Description of the Related Art

A semiconductor-on-insulator (SOI) field effect transistor (FET) is a FET formed in the semiconductor layer of a semiconductor-on-insulator wafer. Shallow trench isolations (STI) structures extend through the semiconductor layer and isolated the SOI FET from other devices within the semiconductor layer. As with any FET, an SOIFET comprises a channel region positioned between source/drain regions and a gate structure positioned above the channel region. However, depending upon the configuration of the source/drain regions as well as the thickness of the semiconductor layer, the channel region of the SOIFET may be fully depleted (FD) or partially depleted (PD). Specifically, in a FDSOIFET, the depletion layer of the channel region between the source/drain regions encompasses the full thickness of the semiconductor layer. In a PDSOIFET, the depletion layer between the source/drain regions is only located in an upper portion of the semiconductor layer near the top surface.

In a PDSOIFET, the non-depleted portion of the channel region that is between the source/drain regions and below the depletion layer is typically referred to as the body of the FET. If this body is not contacted, it is referred to as a floating body. Since the floating body is not contacted (i.e., not biased), its voltage may vary (e.g., as result of carrier generation and thereby accumulation). Variations in the voltage of the floating body will lead to variations in the threshold voltage (Vt) of the PDSOIFET. Furthermore, such threshold voltage variations can differ between PDSOIFETs at different locations within an electronic circuit and can, thereby degrade the performance of the electronic circuit.

Generally, the body contacts for PDSOIFETs must be ohmic contacts so that the current-voltage (I-V) curve is linear and symmetric and also to avoid snapback. To achieve an ohmic body contact, it is necessary to avoid placing the contact on an area of the device implanted with source/drain dopants or, more particularly, to avoid placing the contact on an area of the device implanted with source/drain extension dopants. This is because an area of the device implanted with such dopants will have an opposite conductivity type than the body of the FET, thereby forming a PN junction which blocks the connection between the contact and the body. In FETs designed for high-voltage applications, a heavily tilted implant process is used to form deep source/drain extension regions and this heavily tilted implant process can impact a relatively large surface area of the substrate. Typically, to accommodate for the heavily tilted source/drain extension implantation process, a relatively wide shallow trench isolation (STI) structure is formed surrounding the active region of the FET and the body contact is formed outside this STI structure. Ground rules may, for example, require that the body contact by separated from the active region of the FET by a distance of 2.0 µm or more. Unfortunately, this solution adds to the area of the wafer consumed by the FET. An alternative solution involves a hybrid STI structure, which allows the body contact to be formed closer to the active region of the FET. However, this solution involves additional processing steps that add to processing time and costs. Therefore, there is a need in art for a FET having one or more ohmic body contacts that can be placed relatively close to the active region of the FET and a method of forming such a FET.

SUMMARY

In view of the foregoing disclosed herein are embodiments of a field effect transistor (FET) structure, in which ohmic body contact(s) are placed relatively close to (e.g., within 1.00 µm of) the active region of the FET. The FET can comprise a semiconductor layer, in which an active region and body contact region(s) are defined by a trench isolation structure and in which a body region is below and abuts the active region, the trench isolation structure and the body contact region(s). A gate structure can traverse the active region. Additionally, dummy gate structure(s) can be positioned on the body contact region(s). A contact can extend through each dummy gate structure to the body contact region below. Dielectric material (e.g., dielectric sidewall spacers and/or interlayer dielectric material) can electrically isolate the contact(s) from the dummy gate structure(s). During processing, the dummy gate structure(s) can act as blocks to ensure that the body contact region(s) of the FET are not implanted with source/drain dopants and, more particularly, not implanted with source/drain extension dopants and, thereby to ensure that the body contact(s), as formed, are ohmic. Also disclosed herein are embodiments an integrated circuit structure with stacked FETs having such ohmic body contacts and associated method embodiments.

More particularly, disclosed herein are embodiments of a field effect transistor (FET). This FET can comprise a semiconductor layer having an active region and a first body contact region positioned laterally adjacent to the active region. Optionally, the semiconductor layer can also have a second body contact region. In this case, the active region can be positioned laterally between the first and second body contact regions. The semiconductor layer can further have a body region below and abutting the active region and the body contact region(s). A trench isolation structure can be positioned at the top surface of the semiconductor layer and can isolate the active region from the body contact region(s) without extending vertically through the body region. The FET can also comprise a gate structure that traverses the active region of the semiconductor layer and a first dummy gate structure positioned on the first body contact region. A first contact can extend vertically through a first opening in the first dummy gate structure to the first body contact region. This first contact can be electrically isolated from the first dummy gate structure (e.g., by dielectric materials, such as dielectric spacer and/or interlay dielectric materials). If the semiconductor layer has a second body contact region, the FET can further comprise a second dummy gate structure positioned on the second body contact region. A second contact can extend vertically through a second opening in the second dummy gate structure to the second body contact region. Like the first contact, this second contact can be electrically isolated from the second dummy gate structure (e.g., by dielectric materials, such as dielectric spacer and/or interlay dielectric materials). During processing, the dummy gate structure(s) can act as blocks to ensure that the body contact region(s) of the FET are not implanted with source/drain dopants or, more particularly, not implanted with source/drain extension dopants, and, thereby to ensure that the first and second contacts, as formed, are ohmic.

Also disclosed herein are embodiments of an integrated circuit structure with a plurality of stacked field effect transistors (i.e., stacked FETs). The FETs can comprise a semiconductor layer having an active region and a first body contact region positioned laterally adjacent to the active region. Optionally, the semiconductor layer can also have a second body contact region. In this case, the active region can be positioned laterally between the first and second body contact regions. The semiconductor layer can further have a body region below and abutting the active region and the body contact region(s). A trench isolation structure can be positioned at the top surface of the semiconductor layer and can isolate the active region from the body contact region(s) without extending vertically through the body region. The FETs can also comprise a plurality of gate structures that traverse the active region of the semiconductor layer and a first dummy gate structure positioned on the first body contact region. First contacts can extend vertically through first openings in the first dummy gate structure to the first body contact region. These first contacts can be electrically isolated from the first dummy gate structure (e.g., by dielectric materials, such as dielectric spacer and/or interlay dielectric materials). If the semiconductor layer has a second body contact region, the FETs can further comprise a second dummy gate structure positioned on the second body contact region. Second contacts can extend vertically through second openings in the second dummy gate structure to the second body contact region. Like the first contacts, these second contacts can be electrically isolated from the second dummy gate structure (e.g., by dielectric materials, such as dielectric spacer and/or interlay dielectric materials). During processing, the dummy gate structure(s) can act as blocks to ensure that the body contact region(s) of the FETs are not implanted with source/drain dopants or, more particularly, not implanted with source/drain extension dopants and, thereby to ensure that the first and second contacts, as formed, are ohmic.

Also disclosed herein are embodiments of a method of forming the above-described field effect transistor (FET). The method embodiments can comprise providing a semiconductor layer, having a first conductivity type. A trench isolation structure can be formed at a top surface of the semiconductor layer so as to define, within the semiconductor layer, an active region, a first body contact region positioned laterally adjacent to and isolated from the active region, and a body region below and abutting the active region, the trench isolation structure and the first body contact region. Optionally, the trench isolation structure can further be formed so as to define, within the semiconductor layer, a second body contact region such that the active region is positioned laterally between the first body contact region and the second body contact region and such that the body region extends below and abuts the second body contact region as well.

After the trench isolation structure is formed, a gate stack can be formed. Specifically, a gate dielectric layer can be formed over the active region, body contact region(s) and the trench isolation structure. Then, a gate conductor layer can be formed on the gate dielectric layer. Next, the gate stack can be patterned to form a gate structure traversing the active region. The gate stack can further be patterned to form a first dummy gate structure on the first body contact region and having a first opening extending vertically through its center to the first body contact region. Additionally, if a second body contact region is defined in the semiconductor layer, the gate stack can further be patterned to form a second dummy gate structure on the second body contact region and having a second opening extending vertically through its center to the second body contact region.

Next, a second conductivity type dopant can be implanted into the active region of the semiconductor layer on opposing sides of the gate structure to form source/drain extension regions. This dopant implantation process can be performed using the dummy gate structure(s) as blocks to prevent implantation of the second conductivity type dopant into the body contact region(s). Following source/drain extension region formation, dielectric sidewall spacers can be formed on the sidewalls of both the gate structure and the dummy gate structure(s) and source/drain regions can be formed in the exposed portions of the active region.

Next, one or more interlayer dielectrics can be deposited and a plurality of contacts for the field effect transistor can be formed. This process of forming the contacts can comprise forming a first contact extending vertically through the first opening to the first body contact region such that the first contact is electrically isolated (e.g., by the dielectric sidewall spacers and/or interlayer dielectrics) from the first dummy gate structure and, if applicable, forming a second contact extending vertically through the second opening to the second body contact region such that the second contact is electrically isolated (e.g., by the dielectric sidewall spacers and/or interlayer dielectrics) from the second dummy gate structure.

Also disclosed herein are embodiments of a method of forming an integrated circuit structure with a plurality of stacked field effect transistors (i.e., stacked FETs). The method embodiments can comprise providing a semiconductor layer, having a first conductivity type. A trench isolation structure can be formed at a top surface of the semiconductor layer so as to define, within the semiconductor layer, an active region for the FETs, a shared first body contact region for the FETs positioned laterally adjacent to and isolated from the active region, and a shared body region for the FETs below and abutting the active region, the trench isolation structure and the first body contact region. Optionally, the trench isolation structure can further be formed so as to define, within the semiconductor layer, a shared second body contact region such that the active region is positioned laterally between the first body contact region and the second body contact region and such that the body region extends below and abuts the second body contact region as well.

After the trench isolation structure is formed, a gate stack can be formed. Specifically, a gate dielectric layer can be formed over the active region, body contact region(s) and the trench isolation structure. Then, a gate conductor layer can be formed on the gate dielectric layer. Next, the gate stack can be patterned to form a plurality of gate structures traversing the active region. The gate stack can further be patterned to form a first dummy gate structure on the first body contact region and having a plurality of first openings extending vertically through its center to the first body contact region. Additionally, if a second body contact region is defined in the semiconductor layer, the gate stack can further be patterned to form a second dummy gate structure on the second body contact region and having a plurality of second openings extending vertically through its center to the second body contact region.

Next, a second conductivity type dopant can be implanted into the active region of the semiconductor layer on opposing sides of each of the gate structures to form source/drain extension regions for each of the FETs in the stack. This dopant implantation process can be performed using the dummy gate structure(s) as blocks to prevent implantation of the second conductivity type dopant into the body contact region(s). Following source/drain extension region formation, dielectric sidewall spacers can be formed on the sidewalls of both the gate structure and the dummy gate structure(s) and source/drain regions can be formed in the exposed portions of the active region.

Next, one or more interlayer dielectrics can be deposited and a plurality of contacts for the field effect transistor can be formed. This process of forming the contacts can comprise forming first contacts extending vertically through the first openings to the first body contact region such that the first contacts are electrically isolated (e.g., by the dielectric sidewall spacers and/or interlayer dielectrics) from the first dummy gate structure and, if applicable, forming second contacts extending vertically through the second openings to the second body contact region such that the second contacts are electrically isolated (e.g., by the dielectric sidewall spacers and/or interlayer dielectrics) from the second dummy gate structure.

BRIEF DESCRIPTION OF THE SEVERAL VIEWS OF THE DRAWINGS

The embodiments disclosed herein will be better understood from the following detailed description with reference to the drawings, which are not necessarily drawn to scale and in which:

FIG. 9A is a cross-section diagram of a partially completed field effect transistor formed according to the method of FIG. 7;

FIG. 9B is a top view diagram of the same partially completed field effect transistor shown in FIG. 9A;

FIG. 11A is a cross-section diagram of a partially completed field effect transistor formed according to the method of FIG. 7;

FIG. 11B is a top view diagram of the same partially completed field effect transistor shown in FIG. 11A;

FIG. 17A is a cross-section diagram of a partially completed field effect transistor formed according to the method of FIG. 15;

FIG. 17B is a top view diagram of the same partially completed field effect transistor shown in FIG. 17A;

DETAILED DESCRIPTION

Figure 1:
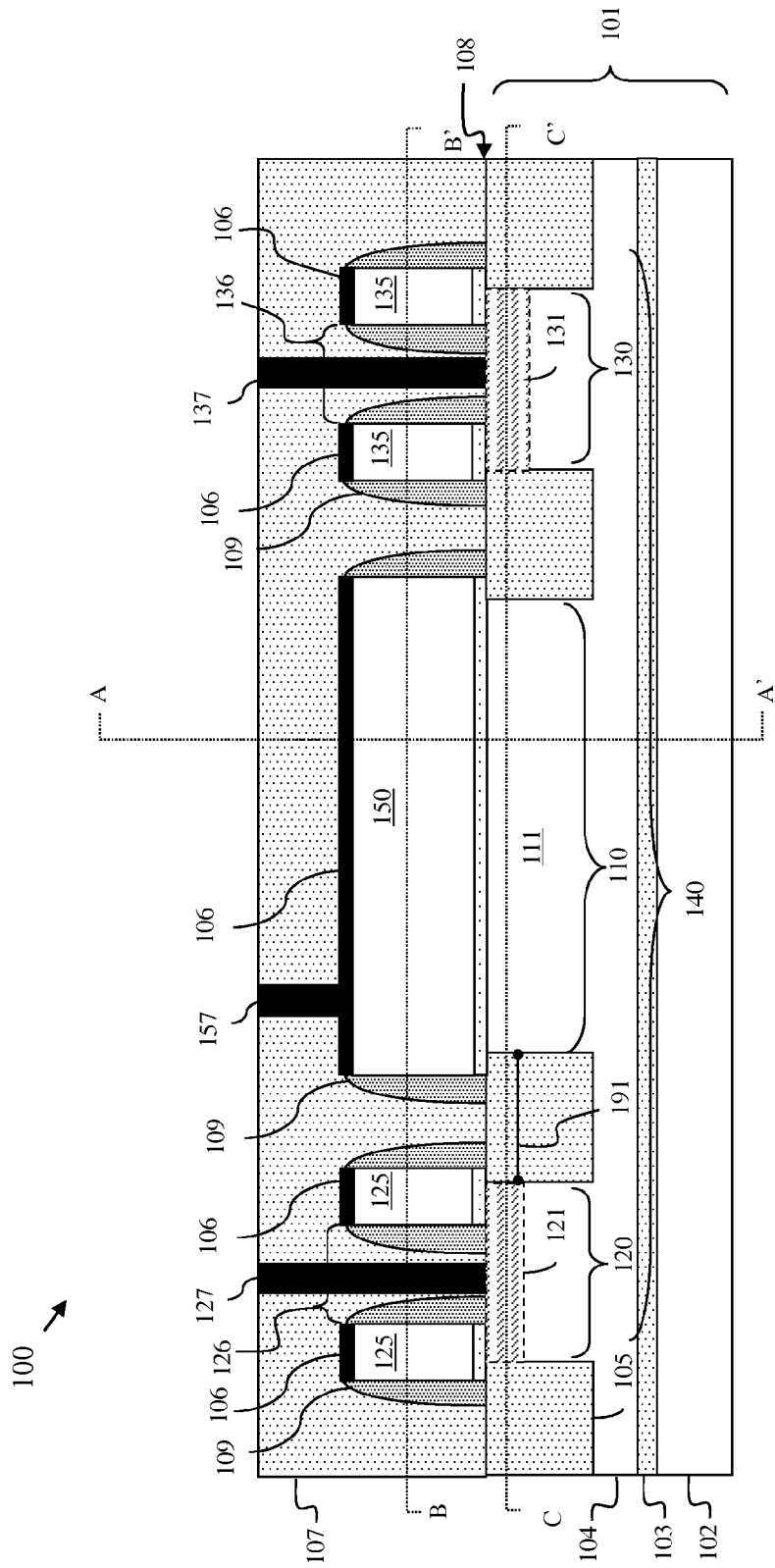
FIG. 1 is a cross-section illustration of an embodiment of a field effect transistor through a vertical plane, which cuts across the width of the device.

The embodiments of the invention and the various features and advantageous details thereof are explained more fully with reference to the non-limiting embodiments that are illustrated in the accompanying drawings and detailed in the following description.

As mentioned above, the body contacts for partially-depleted semiconductor-on-insulator field effect transistors (PDSOIFETs) must be ohmic contacts so that the current-voltage (I-V) curve is linear and symmetric and also to avoid snapback. To achieve an ohmic body contact, it is necessary to avoid placing the contact on an area of the device implanted with source/drain or source/drain extension dopants. This is because an area of the device implanted with such dopants will have an opposite conductivity type than the body of the FET, thereby forming a PN junction which blocks the connection between the contact and the body. In FETs designed for high-voltage applications, a heavily tilted implant process is used to form deep source/drain extension regions and this heavily tilted implant process can impact a relatively large surface area of the substrate. Typically, to accommodate for the heavily tilted source/drain extension implantation process, a relatively wide shallow trench isolation (STI) structure is formed surrounding the desired active region of the FET and the body contact is formed outside this STI structure. Ground rules may, for example, require that the body contact by separated from the active region of the FET by a distance of 2.0 µm or more. Unfortunately, this solution adds to the area of the wafer consumed by the FET. An alternative solution involves a hybrid STI structure, which allows the body contact to be formed closer to the active region of the FET. However, this solution involves additional processing steps that add to processing time and costs.

In view of the foregoing disclosed herein are embodiments of a field effect transistor (FET) structure, in which ohmic body contact(s) are placed relatively close to (e.g., within 1.00 µm of) the active region of the FET. The FET can comprise a semiconductor layer, in which an active region and body contact region(s) are defined by a trench isolation structure and in which a body region is below and abuts the active region, the trench isolation structure and the body contact region(s). A gate structure can traverse the active region. Additionally, dummy gate structure(s) can be positioned on the body contact region(s). A contact can extend through each dummy gate structure to the body contact region below. Dielectric material (e.g., dielectric sidewall spacers and/or interlayer dielectric material) can electrically isolate the contact(s) from the dummy gate structure(s). During processing, the dummy gate structure(s) can act as blocks to ensure that the body contact region(s) of the FET are not implanted with source/drain dopants or, more particularly, not implanted with source/drain extension dopants and, thereby to ensure that the body contact(s), as formed, are ohmic. Also disclosed herein are embodiments an integrated circuit structure with stacked FETs having such ohmic body contacts and associated method embodiments.

It should be noted that in the structure and method embodiments described below the "first conductivity type" and "second conductivity type" will vary depending upon whether described field effect transistor is a n-type field effect transistor (NFET) or p-type field effect transistor (PFET). Specifically, for an NFET, the first conductivity type refers to P-type conductivity and the second conductivity type refers to N-type conductivity. However, for a PFET the reverse is true. That is, for a PFET, the first conductivity type refers to N-type conductivity and the second conductivity type refers to P-type conductivity. It should further be noted that in the structure and method embodiments described below, a P-type dopant can comprise, for example, a Group III dopant, such as boron (B) or indium (In), and an N-type dopant can comprise, for example, a Group V dopant, such as arsenic (As), phosphorous (P) or antimony (Sb)).

Figure 2:
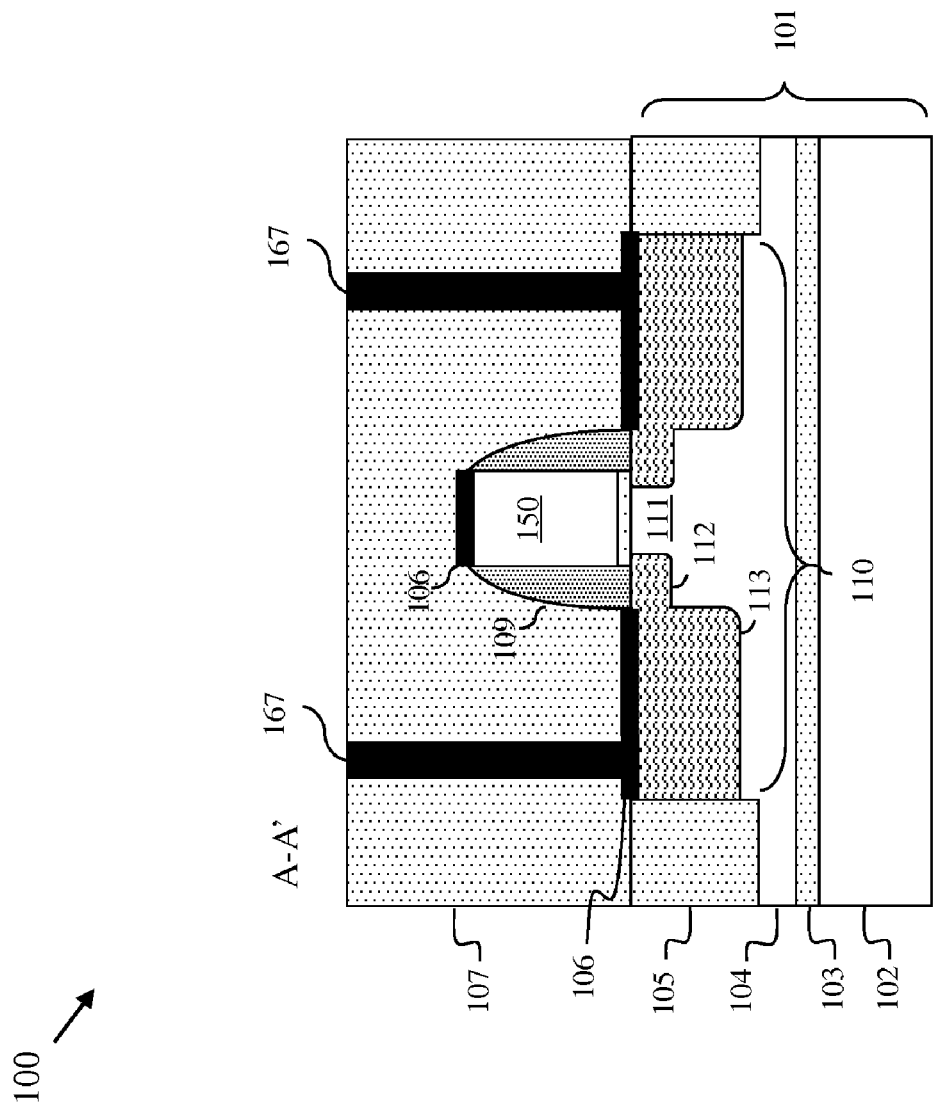
FIG. 2 is a cross-section illustration of the same field effect transistor as shown in FIG. 1 through a vertical plane A-A', which cuts across the length of the device.
Figure 3:
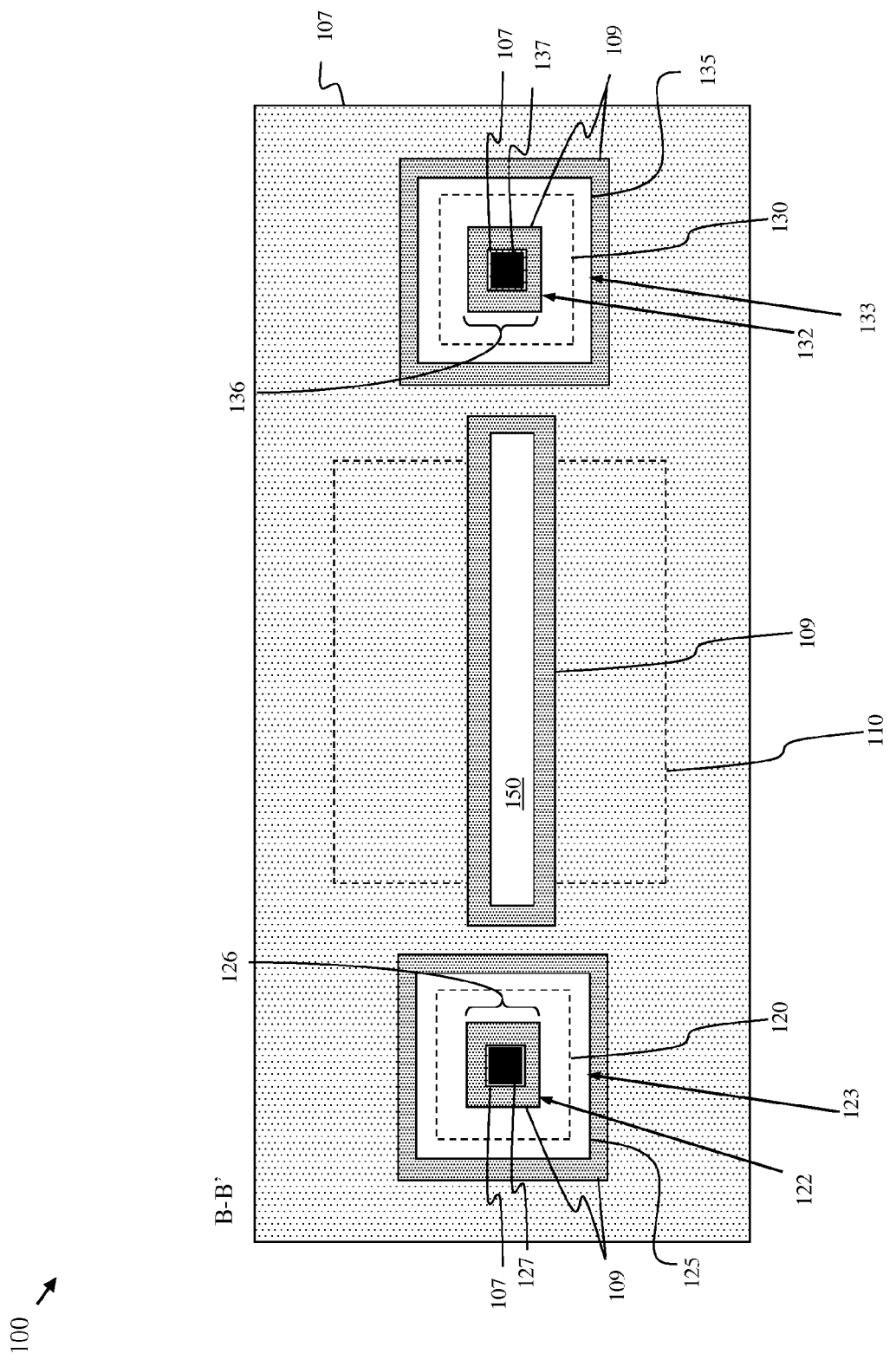
FIG. 3 is a cross-section illustration of the same field effect transistor as shown in FIG. 1 through a horizontal plane B-B'.

More particularly, FIGS. 1-3 illustrate an embodiment of field effect transistor (FET) structure 100, according to the present invention, having ohmic body contact(s) 127, 137 placed relatively close to (e.g., within 1.00 µm of) the active region 110 of the FET. Specifically, FIG. 1 is a cross-section illustration of a single FET 100 through a vertical plane, which cuts across the width of the device. FIG. 2 is a cross-section illustration of the same FET 100 through a vertical plane A-A' (as shown in FIG. 1), which cuts across the length of the device. FIG. 3 is a cross-section illustration of the same single FET 100 through a horizontal plane B-B' (as shown in FIG. 1), which cuts across the interlayer dielectric 107.

Referring to FIGS. 1-3 in combination, disclosed herein are embodiments of a field effect transistor (FET) 100. This FET 100 can comprise a semiconductor layer 104, having a top surface 108 and a bottom surface opposite the top surface 108. Specifically, as shown in FIG. 1, this semiconductor layer 104 can comprise a semiconductor layer of a semiconductor-on-insulator (SOI) wafer 101. Such an SOI wafer can comprise a semiconductor substrate 102 (e.g., a silicon substrate or other semiconductor substrate), an insulator layer 103 (e.g., a silicon oxide layer or other suitable insulator layer) on the substrate 102 and a semiconductor layer 104 (e.g., a single crystalline silicon layer or other suitable semiconductor layer) on the insulator layer 102. However, it should be understood that, alternatively, the semiconductor layer 104 can comprise a bulk semiconductor substrate (e.g., a single crystalline silicon substrate) (not shown).

The semiconductor layer 104 can comprise an active region 110 at the top surface 108. As shown in FIG. 2, this active region 110 can comprise source/drain regions 113 on opposing sides of a channel region 111 and source/drain extension regions 112 extending laterally between the channel region 111 and the source/drain regions 113. Optionally, depending upon the application, halo regions (not shown) can positioned laterally between the channel region 111 and the source/drain regions 113 and/or the source/drain extension regions 112. The channel region 111 can be doped with a first conductivity type dopant so as to have a first conductivity type. The source/drain regions 113 and source/drain extension regions 112 can be doped with a second conductivity type dopant so as to have a second conductivity type different from the first conductivity type (i.e., different from the conductivity type of the channel region 111). Various different configurations for these features (i.e., for FET source/drain regions, for FET source/drain extension regions and for FET halo regions) are well-known in the art and can be incorporated into the FET 100. For example, these features can be symmetric (as shown) or asymmetric, can comprise implant regions, epitaxial semiconductor layers or a combination thereof, can incorporate stress layers, etc. Thus, the drawing of these features, as shown in FIG. 2, is offered for illustration purposes only and is not intended to be limiting.

The semiconductor layer 104 can further comprise a first body contact region 120 at the top surface 108 positioned laterally adjacent to the active region 110. Optionally, the semiconductor layer 104 can also comprise a second body contact region 130 at the top surface 108. In this case, the active region 110 can be positioned laterally between the first and second body contact regions 120, 130. The semiconductor layer 104 can further have a body region 140 below and abutting (i.e., in physical contact with) the active region 110 and the body contact region(s) 120, 130. The body contact region(s) 120, 130 and the body region 140, like the channel region 111, can be doped with a first conductivity type dopant so as to have the first conductivity type. Optionally, the semiconductor layer 104 can comprise a first dopant implant region 121 at the top surface 108 within the first body contact region 120. If applicable, the semiconductor layer 104 can also optionally comprise a second dopant implant region 131 at the top surface 108 within the second body contact region 130. These dopant implant regions 121, 131 can be doped with a higher concentration of the first conductivity type dopant than the body region 140 and channel region 111.

A trench isolation structure 105 can be positioned at the top surface 108 of the semiconductor layer 104, can define the shapes and locations of the active region 110 and body contact region(s) 120, 130 and can isolate the active region 110 from the body contact region(s) 120, 130. Specifically, the trench isolation structure 105 can define the shapes and locations of the active region 110 and body contact region(s) 120, 130 so that the distance 191 between them is relatively short (e.g., between 0.25 µm-3.0 µm or greater and, preferably, can be less than 1.0 µm). For illustration purposes, the body contact region(s) 120, 130 are shown in FIG. 3 as being essentially square. Alternatively, the body contact region(s) 120, 130 could be rectangular, circular or any other suitable shape. The depth of the trench isolation structure 105 can be such that it does not extend vertically completely through the body region 140. That is, as shown in FIGS. 1 and 2, the bottom surface of the trench isolation structure 105 is above and physically separated from the bottom surface of semiconductor layer 104. The trench isolation structure 105 can comprise, for example, a conventional shallow trench isolation (STI) structure comprising a trench filled with one or more isolation materials (e.g., a silicon oxide, silicon nitride, silicon oxynitride, etc.).

The FET 100 can further comprise a gate structure 150 that traverses the active region 110 of the semiconductor layer 104. Specifically, as shown in FIG. 2, the gate structure 150 can be positioned above the channel region 111. The gate structure 150 can comprise a gate dielectric layer (e.g., a gate oxide layer, a high-k gate dielectric layer or other suitable gate dielectric layer) on the channel region 111 and a gate conductor layer (e.g., a polysilicon gate conductor layer, a metal gate conductor layer, a dual work function gate conductor layer or other suitable gate conductor layer) on the gate dielectric layer. Dielectric sidewall spacers 109 (e.g., nitride spacers, oxide spacers, oxynitride spacers or other suitable dielectric sidewall spacers) can be positioned on opposing sidewalls of the gate structure 150.

The FET 100 can further comprise a first dummy gate structure 125 positioned on the first body contact region 120. Like the gate structure 150, the first dummy gate structure 125 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer. The first dummy gate structure 125 can have a first opening 126 that extends vertically through the center of the first dummy gate structure 125 to the first body contact region 120 below. Thus, as shown in FIG. 3, the first dummy gate structure 125 can have inner sidewalls 122 within the first opening 126 and outer sidewalls 123 opposite the inner sidewalls 122. Except for this first opening 126, the first dummy gate structure 125 can cover the entire first body contact region 120 and, optionally, can overlap the interface with the trench isolation structure 105 such that the outer sidewalls 123 of the first dummy gate structure 125 are aligned above the trench isolation structure 105. Dielectric sidewall spacers 109 (e.g., nitride spacers, oxide spacers, oxynitride spacers or other suitable dielectric sidewall spacers) can be positioned on the inner and outer sidewalls 122-123 of the first dummy gate structure 125.

Additionally, if the semiconductor layer 104 has a defined second body contact region 130, the FET 100 can further comprise a second dummy gate structure 135 positioned on the second body contact region 130. Like the gate structure 150 and first dummy gate structure 125, the second dummy gate structure 135 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer. The second dummy gate structure 135 can have a second opening 136 that extends vertically through the center of the second dummy gate structure 135 to the second body contact region 130 below. Thus, as shown in FIG. 3, the second dummy gate structure 135 can have inner sidewalls 132 within the second opening 136 and outer sidewalls 133 opposite the inner sidewalls 132. Except for this second opening 136, the second dummy gate structure 135 can cover the entire second body contact region 130 and, optionally, can overlap the interface with the trench isolation structure 105 such that the outer sidewalls 133 of the second dummy gate structure 135 are aligned above the trench isolation structure 105. Dielectric sidewall spacers 109 (e.g., nitride spacers, oxide spacers, oxynitride spacers or other suitable dielectric sidewall spacers) can be positioned on inner and outer sidewalls 132-133 of the second dummy gate structure 135.

Optionally, the FET 100 can further comprise metal silicide layers 106 on the gate structure 150 and on the dummy gate structure(s) 125, 135, as shown in FIG. 1, and on the source/drain regions 113, as shown in FIG. 2. These metal silicide layers 106 can, for example, comprise a silicide of a refractory or noble metal (e.g., nickel, cobalt, tungsten, chromium, platinum, titanium, molybdenum, palladium, etc.) or an alloy thereof.

One or more layers of dielectric material 107 (i.e., interlayer dielectrics, such as, silicon dioxide, silicon nitride, borophosphosilicate glass (BPSG), etc.) can cover the FET 100, filling in the remaining portions of the openings 126, 136 not filled by the dielectric sidewall spacers 109.

The FET 100 can further comprise a plurality of contacts. Specifically, as shown in FIGS. 1 and 3, a first contact 127 (i.e., a first body contact) can extend vertically through the first opening 126 in the first dummy gate structure 125 to the first body contact region 120 of the semiconductor layer 104. This first contact 127 can be electrically isolated from the first dummy gate structure 120 (e.g., by dielectric materials, such as the dielectric sidewall spacers 109 and/or the dielectric layer(s) 107 within the first opening 126). Additionally, if the semiconductor layer 104 has a defined second body contact region 130 and a second dummy gate structure 135 thereon, a second contact 137 can extend vertically through the second opening 136 in the second dummy gate structure 135 to the second body contact region 130. Like the first contact 127, this second contact 137 can be electrically isolated from the second dummy gate structure 135 (e.g., by dielectric materials, such as the dielectric sidewall spacers 109 and/or the dielectric layer(s) 107 within the second opening 136). As mentioned above, optional dopant implant regions 121, 131 can be positioned at the top surface 108 of the semiconductor layer 104 in the body contact regions 120, 130 and such dopant implant regions 121, 131 can enhance the electrical connection between the body contacts 127, 137 and the body region 140.

As discussed in greater detail below with regard to the method embodiments, the dummy gate structures 125, 135 function as blocks during processing and, particularly, during source/drain and source/drain extension dopant implantation processes to ensure that the body contact region(s) 120, 130 of the FET 100 are not implanted with source/drain dopants or source/drain extension dopants (i.e., second conductivity type dopants). Using the dummy gate structures 125, 135 as blocks ensures that the electrical connections from the first and second contacts 127, 137 to the body region 140 are not blocked by PN junctions and, thereby ensures that the first and second contacts 127, 137, as formed, are ohmic. Thus, it should be understood that the size (i.e., area dimension) of the openings 126, 136 in the dummy gate structures 125, 135 can vary (e.g., between 0.01 $\mu m^2$ and 0.25 $\mu m^2$) as a function of the tilt angle used during dopant implantation as well as the height of the gate stack in order to provide the necessary blocking. Other factors to consider when determining the size of the openings 126, 136 may include, but are not limited to, foundry ground rules (e.g., ground rules for contacts, such as contact-to-polysilicon edge rules).

In addition to the contacts 127, 137, described above, other contacts for the FET 100 can include a gate contact 157 that extends vertically through the dielectric layer(s) 107 to the gate structure 150, as shown in FIG. 1, and source/drain contacts 167 that extend vertically through the dielectric layer(s) to the source/drain regions 113, as shown in FIG. 2. It should be understood that the term "dummy gate structure" as used in the specification refers to a structure that resembles a gate structure but is non-functioning. That is, the dummy gate structure(s) 125 and 135 have essentially the same components (e.g., a gate dielectric layer and a gate conductor layer) as the gate structure 150 but do not function as a gate and are, thus, not contacted. The contacts 127, 137, 157 and 167, as described above, can each comprise conventional contact structures. For example, the contacts 127, 137, 157 and 167 can comprise openings in the dielectric layer(s) 107. These openings can be lined with one or more protective liners (e.g., titanium, titanium nitride, etc.) and filled with a conductor (e.g., tungsten). However, it should be understood that any other suitable contact structure could alternatively be used.

Figure 4:
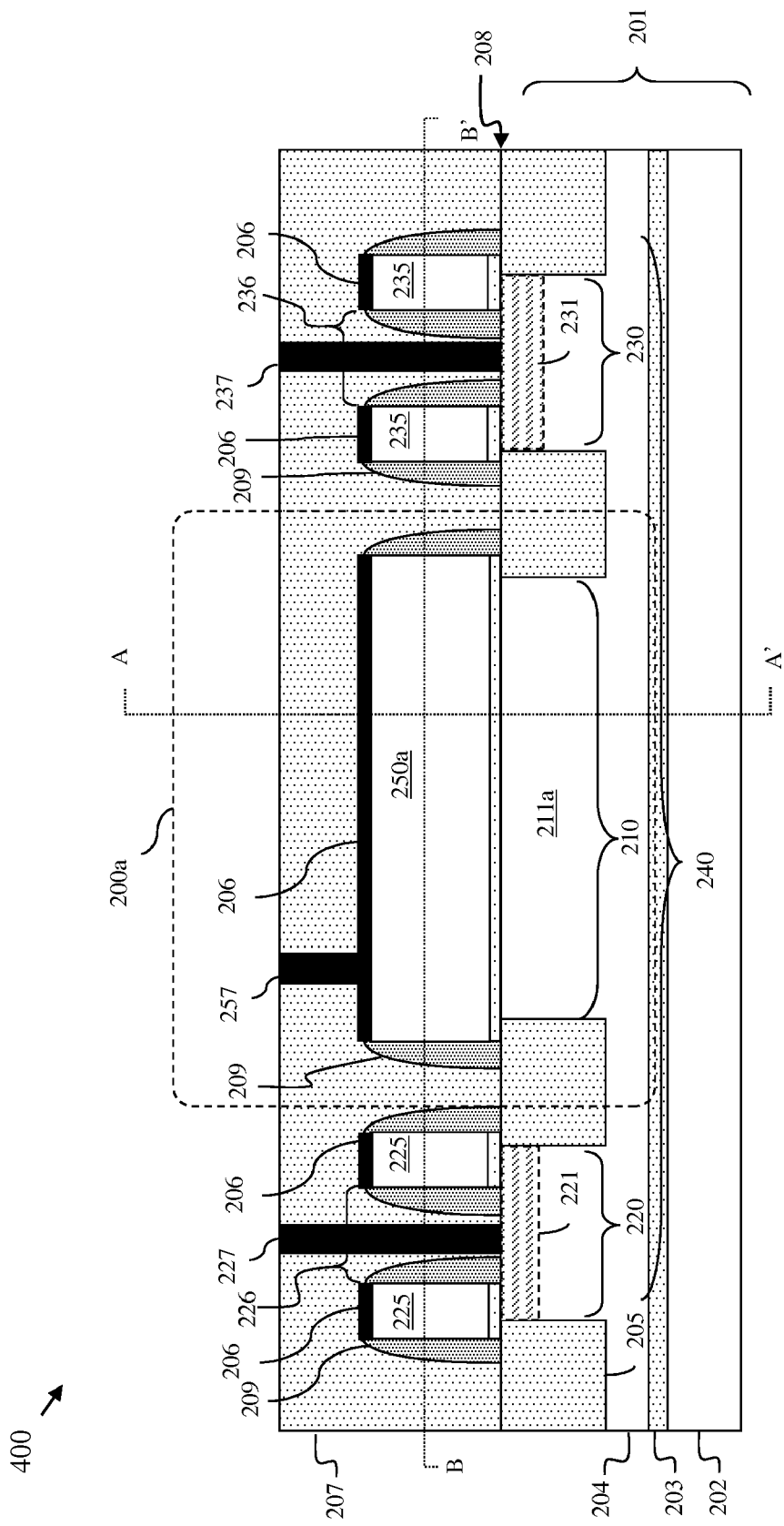
FIG. 4 is a cross-section illustration of an embodiment of an integrated circuit structure with a plurality of stacked field effect transistor through a vertical plane, which cuts across the width of one of the field effect transistors in the stack.
Figure 5:
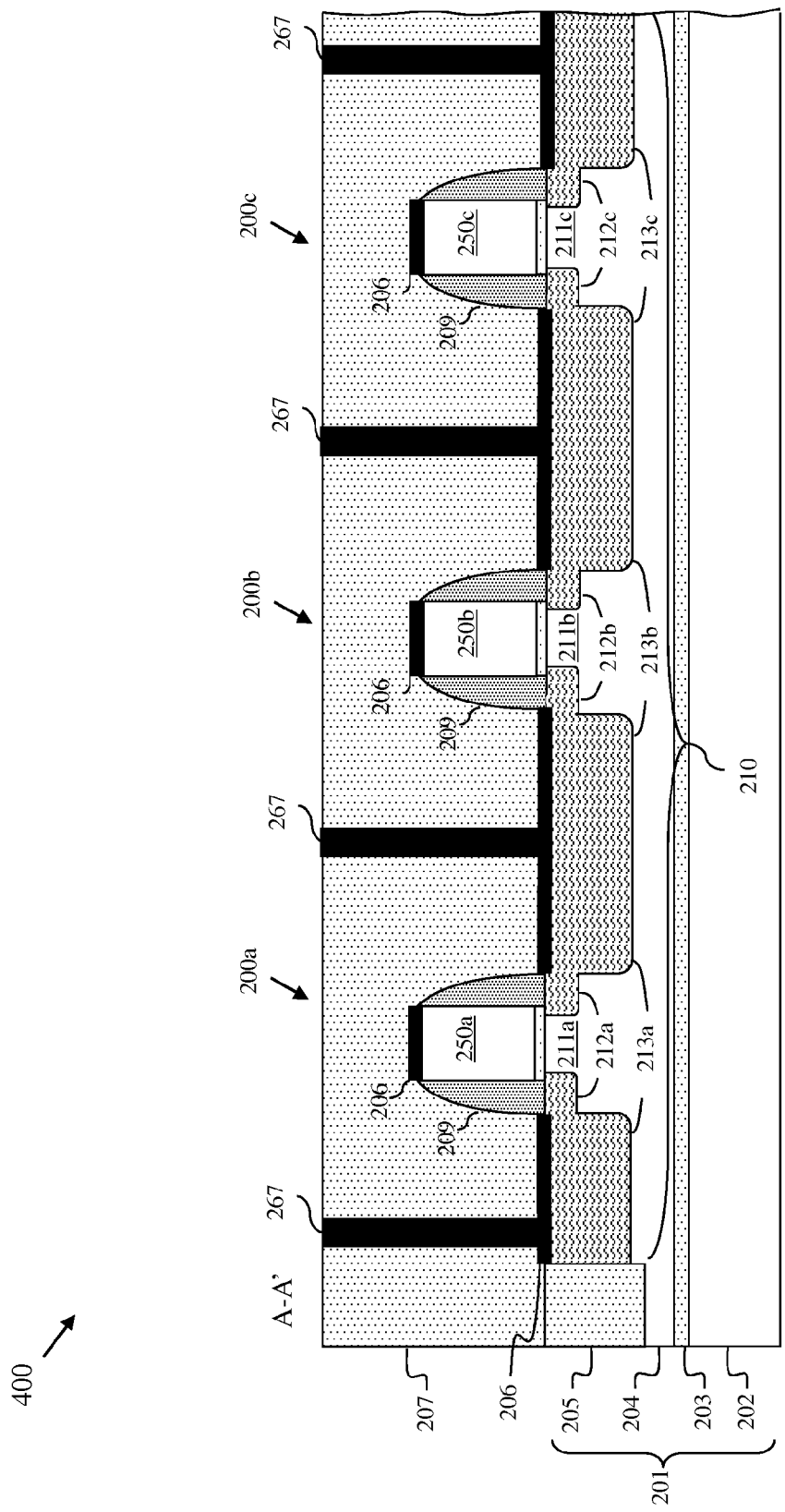
FIG. 5 is a cross-section illustration of the same integrated circuit structure as shown in FIG. 4 through a vertical plane A-A', which cuts across the length of the field effect transistors in the stack.
Figure 6:
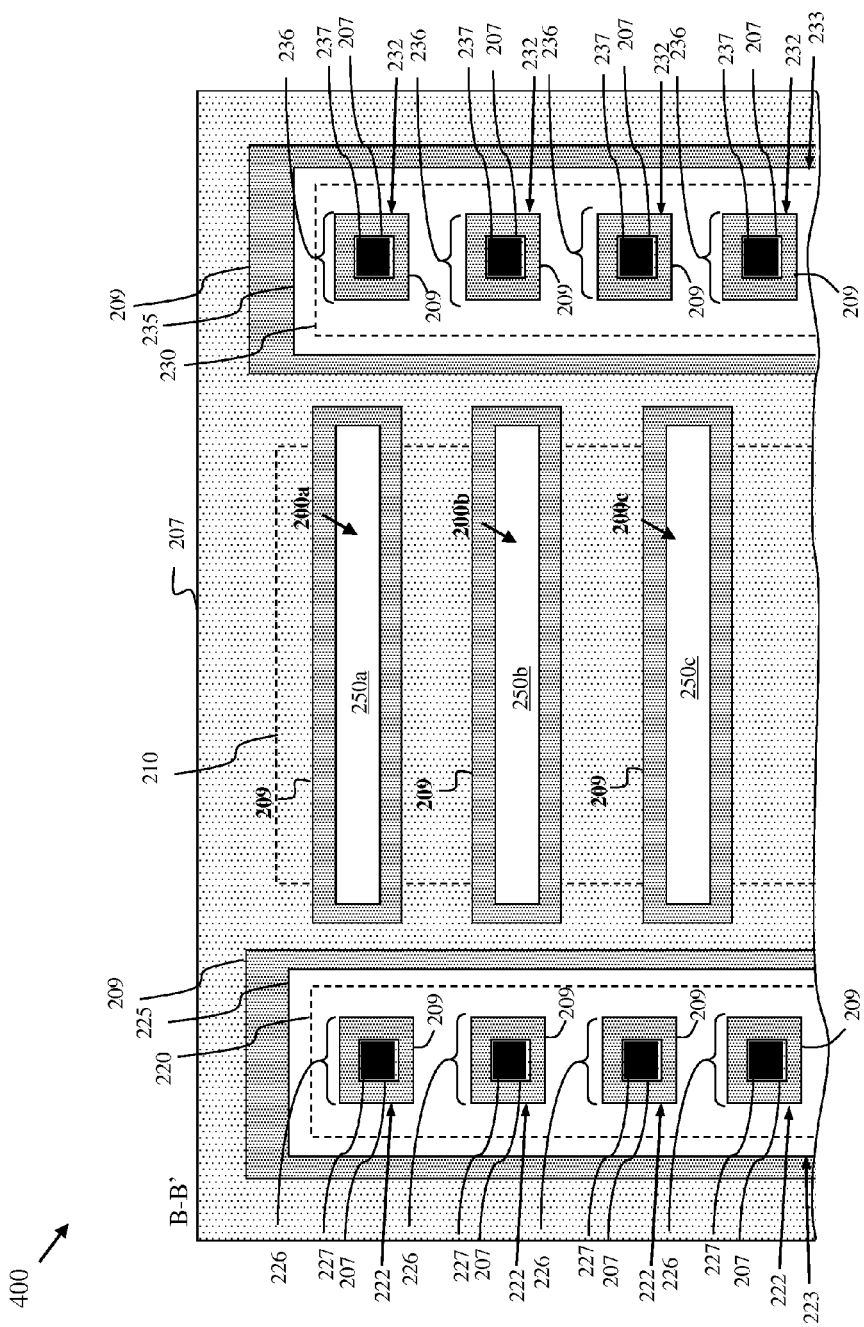
FIG. 6 is a cross-section illustration of the same integrated circuit structure as shown in FIG. 4 through a horizontal plane B-B'.

FIGS. 4-6 illustrate an embodiment of an integrated circuit structure 400, according to the present invention, comprising a plurality of stacked field effect transistor (FET) (i.e., a plurality of field effect transistors connected in series), having ohmic body contact(s) 227, 237 placed relatively close to (e.g., within 1.00 μm of) the active region 210 of the FETs. Specifically, FIG. 4 is a cross-section of the integrated circuit structure 400 through a vertical plane, which cuts across the width of a single one of the FETs (i.e., FET 200a) in the plurality of stacked FETs. FIG. 5 is a cross-section illustration of the same integrated circuit structure 400 through a vertical plane A-A' (as shown in FIG. 1), which cuts across the length of each of the FETs (e.g., 200a-c) in the plurality of stacked FETs. FIG. 6 is a cross-section illustration of the same integrated circuit structure 400 through a horizontal plane B-B' (as shown in FIG. 1), which cuts across the interlayer dielectric 107 above each of the stacked FETs (e.g., 200a-c). For illustration purposes three stacked FETs (e.g., 200a-c) are shown in FIGS. 2 and 3. However, it should be understood that any number of two or more stacked FETs could be incorporated into the integrated circuit structure 400 (e.g., 6, 8 or 13 stacked FETs may be required for a radio frequency (RF) switch, depending upon the voltage rating of the FETs).

Referring to FIGS. 4-6 in combination, disclosed herein are embodiments of an integrated circuit structure comprising a plurality of stacked field effect transistors (FETs) (e.g., 200a-c). This integrated circuit structure 400 can comprise a semiconductor layer 204, having a top surface 208 and a bottom surface opposite the top surface 208. Specifically, as shown in FIG. 4, this semiconductor layer 204 can comprise a semiconductor layer of a semiconductor-on-insulator (SOI) wafer 201. Such an SOI wafer can comprise a semiconductor substrate 202 (e.g., a silicon substrate or other semiconductor substrate), an insulator layer 203 (e.g., a silicon oxide layer or other suitable insulator layer) on the substrate 202 and a semiconductor layer 204 (e.g., a single crystalline silicon layer or other suitable semiconductor layer) on the insulator layer 202. However, it should be understood that, alternatively, the semiconductor layer 204 can comprise a bulk semiconductor substrate (e.g., a single crystalline silicon substrate) (not shown).

The semiconductor layer 204 can comprise an active region 210 for the stacked FETs 200a-c at the top surface 208. As shown in FIG. 5, this active region 210 can comprise, for each FET 200a-c, a channel region 211a-c and source/drain regions 213a-c on opposing sides of each channel region 211a-c. The active region 210 can further comprise, for each FET 200a-c, source/drain extension regions 212a-c extending laterally between each channel region 211a-c and the source/drain regions 213a-c. Optionally, this active region 210 can further comprise, for each FET 200a-c, halo regions (not shown) positioned laterally between each channel region 211a-c and the source/drain regions 213a-c and/or the source/drain extension regions 212a-c. As illustrated, a source/drain region of one FET will abut (i.e., physically contact) a source/drain region of an adjacent FET. For example, a source/drain region 213 of FET 200a will abut a source/drain region 213b of FET 200b and so on.

The channel regions 211a-c can be doped with a first conductivity type dopant so as to have a first conductivity type. The source/drain regions 213a-c and source/drain extension regions 212a-c can be doped with a second conductivity type dopant so as to have a second conductivity type different from the first conductivity type (i.e., different from the conductivity type of the channel regions 211a-c). Various different configurations for these features (i.e., for FET source/drain regions, for FET source/drain extension regions and for FET halo regions) are well-known in the art and can be incorporated into each of the FETs 200a-c. For example, these features can be symmetric (as shown) or asymmetric, can comprise implant regions, epitaxial semiconductor layers or a combination thereof, can incorporate stress layers, etc. Thus, the drawing of these features, as shown in FIG. 5, is offered for illustration purposes only and is not intended to be limiting.

The semiconductor layer 204 can further comprise an elongated first body contact region 220 at the top surface 208 positioned laterally adjacent to and parallel to the active region 210. Optionally, the semiconductor layer 204 can also comprise an elongated second body contact region 230 at the top surface 208 also parallel to the active region 210. In this case, the active region 210 can be positioned laterally between the first and second body contact regions 220, 230. The semiconductor layer 204 can further have a body region 240 below and abutting (i.e., in physical contact with) the active region 210 and, particularly, the channel regions 211a-c within the active region 210 and also below and abutting (i.e., in physical contact with) the body contact region(s) 220, 230. The body contact region(s) 220, 230 and the body region 240, like the channel regions 211a-c of each of the FETs, can be doped with a first conductivity type dopant so as to have the first conductivity type. Optionally, the semiconductor layer 204 can comprise a first dopant implant region 221 at the top surface 208 within the first body contact region 220. If applicable, the semiconductor layer 204 can also optionally comprise a second dopant implant region 231 at the top surface 208 within the second body contact region 230. These dopant implant regions 221, 231 can be doped with a higher concentration of the first conductivity type dopant than the body region 240 and channel regions 211a-c.

A trench isolation structure 205 can be positioned at the top surface 208 of the semiconductor layer 204, can define the shapes and locations of the active region 210 and body contact region(s) 220, 230 and can isolate the active region 210 from the body contact region(s) 220, 230. Specifically, the trench isolation structure 205 can define the shapes and locations of the active region 210 and body contact region(s) 220, 230 so that the distance 291 between them is relatively short (e.g., between 0.25 μm-3.0 μm or greater and, preferably, can be less than 1.0 μm). For illustration purposes, the body contact region(s) 220, 230 are shown in FIG. 3 as being essentially rectangular and approximately equal in length to the active region 210. Alternatively, the body contact region(s) 220, 230 could be an oval or any other suitable elongated shape. The depth of the trench isolation structure 205 can be such that it does not extend vertically completely through the body region 240. That is, as shown in FIGS. 4 and 5, the bottom surface of the trench isolation structure 205 is above and physically separated from the bottom surface of semiconductor layer 204. The trench isolation structure 205 can comprise, for example, a conventional shallow trench isolation (STI) structure comprising a trench filled with one or more isolation materials (e.g., a silicon oxide, silicon nitride, silicon oxynitride, etc.).

The integrate circuit structure 400 can further comprise, for each of the FETs 200a-c, corresponding gate structures 250a-c that traverse the active region 210 of the semiconductor layer 204. Specifically, as shown in FIG. 5, each gate structure 250a-c can be positioned above a corresponding channel region 211a-c. Each gate structure 250a-c can comprise a gate dielectric layer (e.g., a gate oxide layer, a high-k gate dielectric layer or other suitable gate dielectric layer) on its corresponding channel region 111a-c and a gate conductor layer (e.g., a polysilicon gate conductor layer, a metal gate conductor layer, a dual work function gate conductor layer or other suitable gate conductor layer) on the gate dielectric layer. Dielectric sidewall spacers 209 (e.g., nitride spacers, oxide spacers, oxynitride spacers or other suitable dielectric sidewall spacers) can be positioned on opposing sidewalls of each of the gate structure 250a-c.

The integrated circuit structure 400 can further comprise a first dummy gate structure 225 positioned on the first body contact region 220. Like the gate structures 250a-c, the first dummy gate structure 225 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer. The first dummy gate structure 225 can have a plurality of first openings 226 that extend vertically through the center of the first dummy gate structure 225 to the first body contact region 220 below and that are oriented in a line that runs the length of the first dummy gate structure 225 (i.e., in a line that is parallel to the active region 210). Thus, as shown in FIG. 6, the first dummy gate structure 225 can have inner sidewalls 222 within each first opening 226 and outer sidewalls 223. Except for the first openings 226, the first dummy gate structure 225 can cover the entire first body contact region 220 and, optionally, can overlap the interface with the trench isolation structure 205 such that the outer sidewalls 223 of the first dummy gate structure 225 are aligned above the trench isolation structure 205. Dielectric sidewall spacers 209 (e.g., nitride spacers, oxide spacers, oxynitride spacers or other suitable dielectric sidewall spacers) can be positioned on both the inner and outer sidewalls 222-223 of the first dummy gate structure 225.

Additionally, if the semiconductor layer 204 has a defined second body contact region 230, the integrate circuit structure 400 can further comprise a second dummy gate structure 2135 positioned on the second body contact region 230. Like the gate structures 250a-c and first dummy gate structure 225, the second dummy gate structure 235 can comprise a gate dielectric layer (e.g., a gate oxide layer, a high-k gate dielectric layer or other suitable gate dielectric layer) and a gate conductor layer (e.g., a polysilicon gate conductor layer, a metal gate conductor layer, a dual work function gate conductor layer or other suitable gate conductor layer) on the gate dielectric layer. The second dummy gate structure 235 can have a plurality of second openings 236 that extend vertically through the center of the second dummy gate structure 235 to the second body contact region 230 below and that are oriented in a line that runs the length of the second dummy gate structure 235 (i.e., in a line that is parallel to the active region 210). Thus, as shown in FIG. 6, the second dummy gate structure 235 can have inner sidewalls 232 within each second opening 236 and outer sidewalls 233. Except for the second openings 226, the second dummy gate structure 235 can cover the entire second body contact region 230 and, optionally, can overlap the interface with the trench isolation structure 205 such that the outer sidewalls 233 of the second dummy gate structure 225 are aligned above the trench isolation structure 205. Dielectric sidewall spacers 209 (e.g., nitride spacers, oxide spacers, oxynitride spacers or other suitable dielectric sidewall spacers) can be positioned on both the inner and outer sidewalls 222-223 of the first dummy gate structure 225.

Optionally, the FETs 200a-c can further comprise metal silicide layers 206 on the gate structures 250a-c and on the dummy gate structure(s) 225, 235, as shown in FIG. 4, and on the source/drain regions 213a-c, as shown in FIG. 5. These metal silicide layers 206 can, for example, comprise a silicide of a refractory or noble metal (e.g., nickel, cobalt, tungsten, chromium, platinum, titanium, molybdenum, palladium, etc.) or an alloy thereof.

One or more layers of dielectric material 207 (i.e., inter-layer dielectrics, such as, silicon dioxide, silicon nitride, borophosphosilicate glass (BPSG), etc.) can cover the integrated circuit structure 400, filling in the remaining portions of the openings 226, 236 not filled by the dielectric sidewall spacers 209.

The integrated circuit structure 400 can further comprise a plurality of contacts for each of the FETs 200a-c. Specifically, as shown in FIGS. 4 and 6, first contacts 227 (i.e., first body contacts) can extend vertically through each first opening 226 in the first dummy gate structure 225 to the first body contact region 220 of the semiconductor layer 204. These first contacts 227 can be electrically isolated from the first dummy gate structure 220 (e.g., by dielectric materials, such as the dielectric sidewall spacers 209 and/or the dielectric layer(s) 207 within the first openings 226). Additionally, if the semiconductor layer 204 has a defined second body contact region 230 and a second dummy gate structure 235 thereon, second contacts 237 can extend vertically through the second openings 236 in the second dummy gate structure 235 to the second body contact region 230. Like the first contacts 227, these second contacts 237 can be electrically isolated from the second dummy gate structure 235 (e.g., by dielectric materials, such as the dielectric sidewall spacers 209 and/or the dielectric layer(s) 207 within the second openings 236). As mentioned above, optional dopant implant regions 221, 231 can be positioned at the top surface 208 of the semiconductor layer 204 in the body contact regions 220, 230 and such dopant implant regions 221, 231 can enhance the electrical connection between the body contacts 227, 237 and the body region 240.

As discussed in greater detail below with regard to the method embodiments, the dummy gate structures 225, 235 function as blocks during processing and, particularly, during source/drain and source/drain extension dopant implantation processes to ensure that the body contact region(s) 220, 230 for the stacked FETs 200a-c are not implanted with source/drain dopants or source/drain extension dopants (i.e., second conductivity type dopants). Using the dummy gate structures 225, 235 as blocks ensures that the electrical connections from the first and second contacts 227, 237 to the body region 240 are not blocked by PN junctions and, thereby ensures that the first and second contacts 227, 237, as formed, are ohmic. Thus, it should be understood that the size (i.e., area dimension) of the openings 226, 236 in the dummy gate structures 225, 235 can vary (e.g., between 0.01 $\mu m^2$ and 0.25 $\mu m^2$) as a function of the tilt angle used during dopant implantation as well as the height of the gate stack in order to provide the necessary blocking. Other factors to consider when determining the size of the openings 226, 236 may include, but are not limited to, foundry ground rules (e.g., ground rules for contacts, such as contact-to-polysilicon edge rules).

In addition to the contacts 227, 237, described above, other contacts for the stacked FETs 200a can include gate contacts that extend vertically through the dielectric layer(s) 207 to the gate structures (e.g., see gate contact 257 in FIG. 4) and source/drain contacts 267 that extend vertically through the dielectric layer(s) to the source/drain regions 213a-c, as shown in FIG. 2. Those skilled in the art will recognize that adjacent source/drain regions (e.g., source/drain regions 213a and 213b, source/drain regions 213b and 213c, etc.) can share contacts (as shown) or be discretely contacted. Additionally, it should be understood that the term "dummy gate structure" as used in the specification refers to a structure that resembles a gate structure but is non-functioning. That is, the dummy gate structure(s) 225 and 235 have essentially the same components (e.g., a gate dielectric layer and a gate conductor layer) as the gate structures 250a-c but do not function as a gate and are, thus, not contacted. The contacts 227, 237, 257 and 267, as described above, can each comprise conventional contact structures. For example, the contacts 227, 237, 257 and 267 can comprise openings in the dielectric layer(s) 207. These openings can be lined with one or more protective liners (e.g., titanium, titanium nitride, etc.) and filled with a conductor (e.g., tungsten). However, it should be understood that any other suitable contact structure could alternatively be used.

Figure 7:
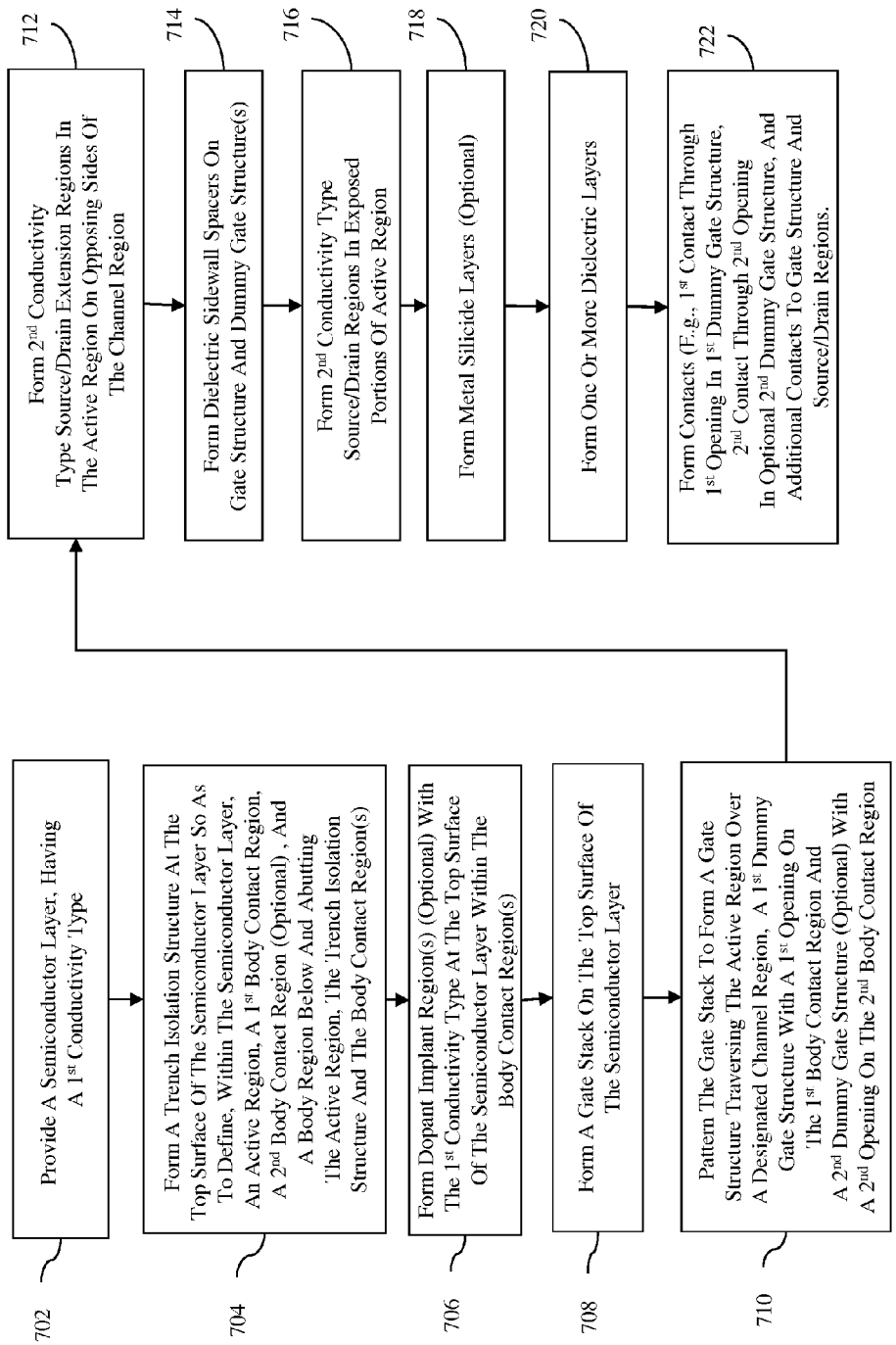
FIG. 7 is a flow diagram illustrating an embodiment of a method of forming the field effect transistor of FIGS. 1-3.
Figure 8A:
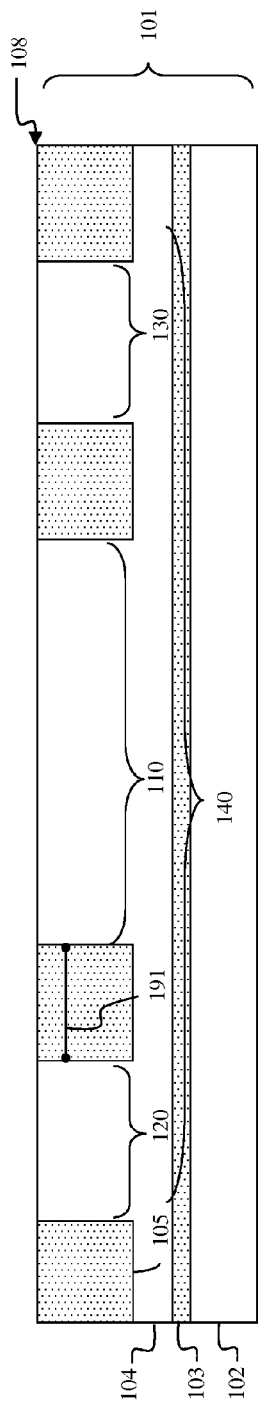
FIG. 8A is a cross-section diagram of a partially completed field effect transistor formed according to the method of FIG. 7.

Referring to FIG. 7, also disclosed herein are embodiments of a method of forming a field effect transistor (FET) 100, as shown in FIGS. 1-3 and described in detail above. The method embodiments can comprise providing a semiconductor layer 104, having a first conductivity type (702). Specifically, as shown in FIG. 8A, this semiconductor layer 104 can comprise a semiconductor layer of a semiconductor-on-insulator (SOI) wafer 101. Such an SOI wafer can comprise a semiconductor substrate 102 (e.g., a silicon substrate or other semiconductor substrate), an insulator layer 103 (e.g., a silicon oxide layer or other suitable insulator layer) on the substrate 102 and a semiconductor layer 104 (e.g., a single crystalline silicon layer or other suitable semiconductor layer) on the insulator layer 102. However, it should be understood that, alternatively, the semiconductor layer 104 can comprise a bulk semiconductor substrate (e.g., a single crystalline silicon substrate) (not shown).

Figure 8B:
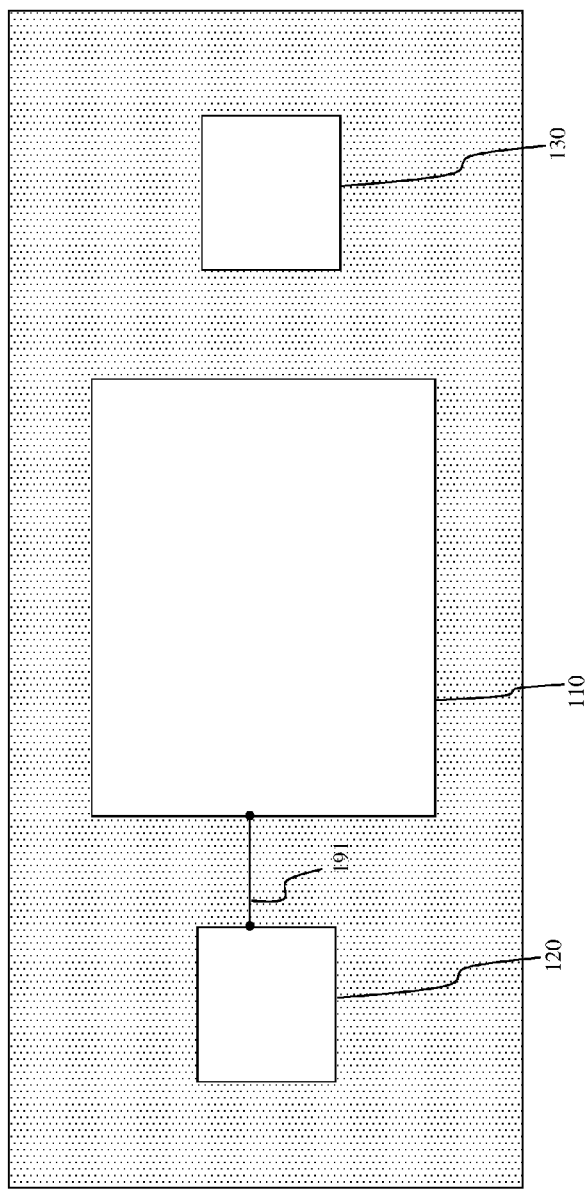
FIG. 8B is a top view diagram of the same partially completed field effect transistor shown in FIG. 8A.

Next, a trench isolation structure 105 can be formed at the top surface 108 of the semiconductor layer 104 so as to define, within the semiconductor layer 104, an active region 110, a first body contact region 120 positioned laterally adjacent to and isolated from the active region 110, and a body region 140 below and abutting the active region 110, the trench isolation structure 105 and the first body contact region 120 (704, see FIGS. 8A-8B). Optionally, the trench isolation structure 105 can also be formed so as to define, within the semiconductor layer 104, a second body contact region 130 such that the active region 110 is positioned laterally between the first body contact region 120 and the second body contact region 130 and such that the body region 140 extends below and abuts the second body contact region 130 as well. More specifically, the trench isolation structure 105 can be formed so as to define the shapes and locations of the active region 110 and body contact region(s) 120, 130 such that the distance 191 between them is relatively short (e.g., between 0.25 μm-3.0 μm or greater and, preferably, can be less than 1.0 μm). For illustration purposes, shape of body contact region(s) 120, 130, as defined by the trench isolation structure 105, is shown in FIG. 8B as being essentially square. Alternatively, the shape of the body contact region(s) 120, 130, as defined by the trench isolation structure, could be rectangular, circular or any other suitable shape.

Such a trench isolation structure 105 can be formed at process 704 using conventional shallow trench isolation (STI) formation techniques. For example, a trench can be lithographically patterned and etched into the semiconductor layer 104 so as to define the shapes and locations of the active region 110 and body contact region(s) 120, 130, as described above, and so that the depth of the trench does not extend vertically completely through the body region 140 (i.e., so that the bottom surface of the trench is above and physically separated from the bottom surface of semiconductor layer 104). Then, to complete the trench isolation structure 105, the trench can be filled with one or more isolation materials (e.g., a silicon oxide, silicon nitride, silicon oxynitride, etc.).

Optionally, after the trench isolation structure 105 is formed at process 704, the active region 110 can be masked and a first dopant implant region 121 can be formed at the top surface 108 of the semiconductor layer 104 within the first body contact region 120 (706, see FIGS. 9A-9B). If a second body contact region 130 was also defined in the semiconductor layer 104, a second dopant implant region 131 can essentially simultaneously be formed at the top surface 108 of the semiconductor layer 104 within the second body contact region 130. These dopant implant regions 121, 131 can be formed using conventional dopant implantation techniques in order to achieve a higher concentration of the first conductivity type dopant in the dopant implant regions 121, 131 than in the body region 140 of the semiconductor layer 104.

Figure 10:
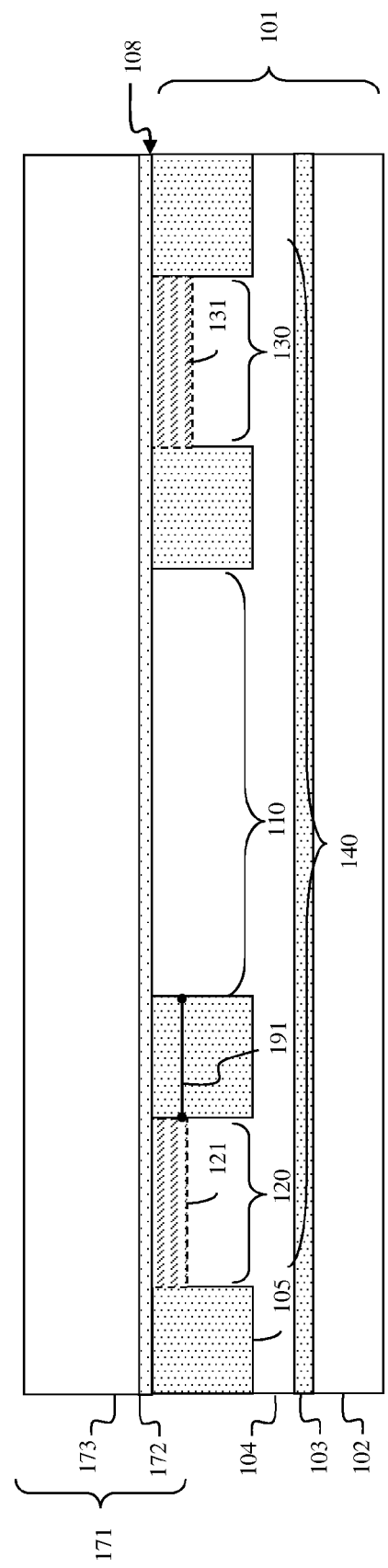
FIG. 10 is a cross-section diagram of a partially completed field effect transistor formed according to the method of FIG. 7.

Next, a gate stack 171 can be formed on the top surface 108 of the semiconductor layer 104 (708, see FIG. 10). Specifically, a gate dielectric layer 172 can be formed (e.g., deposited) over the active region 110, body contact region(s) 120, 130 and the trench isolation structure 105. Then, a gate conductor layer 173 can be formed on the gate dielectric layer 173. Preferably, this gate conductor layer 173 can comprise a polysilicon gate conductor layer. However, alternatively, it could comprise any other suitable gate conductor layer (e.g., a metal gate conductor layer or a dual work function gate conductor layer).

Once the gate stack 171 is formed, it can be patterned to form a gate structure 150 and one or more dummy gate structures 125, 135 (710, see FIGS. 11A-11B). Specifically, the gate stack 171 can be patterned (e.g., using conventional lithographic patterning and etch techniques) to form a gate structure 150 traversing the active region 110 of the FET 100 above a designated channel region 111. The gate stack 171 can further be patterned to form a first dummy gate structure 125 on the first body contact region 120 and having a first opening 126 extending vertically through its center to the first body contact region 120. Specifically, the gate stack 171 can be patterned so that except for this first opening 126, the first dummy gate structure 125 covers the entire first body contact region 120 and, optionally, overlaps the interface with the trench isolation structure 105. In this case, the resulting first dummy gate structure 125 will have inner sidewalls 122 aligned above the first body contact region 120 and outer sidewalls 123 aligned above the trench isolation structure 105. Additionally, if a second body contact region 130 is defined in the semiconductor layer 104, the gate stack 171 can further be patterned to form a second dummy gate structure 135 on the second body contact region 130 and having a second opening 136 extending vertically through its center to the second body contact region 130. Specifically, the gate stack 171 can further be patterned so that except for this second opening 136, the second dummy gate structure 135 covers the entire second body contact region 130 and, optionally, overlaps the interface with the trench isolation structure 105. In this case, the resulting second dummy gate structure 135 will have inner sidewalls 132 aligned above the second body contact region 130 and outer sidewalls 133 aligned above the trench isolation structure 105.

Figure 12:
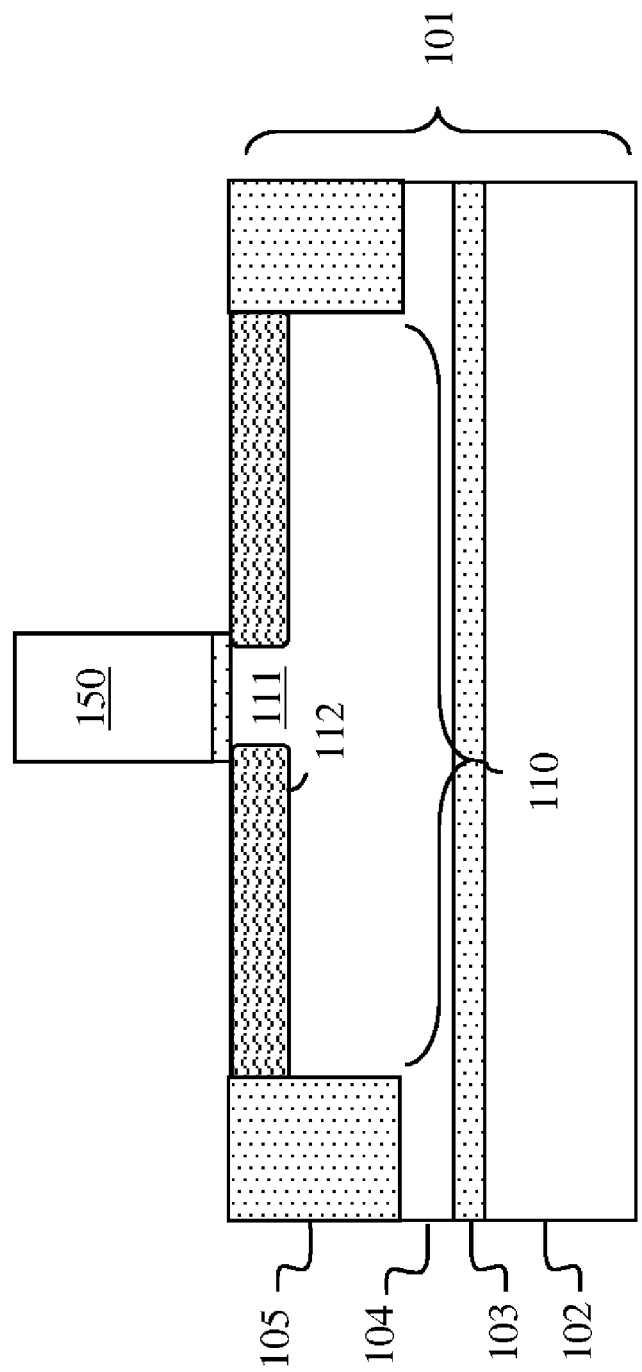
FIG. 12 is a cross-section diagram of a partially completed field effect transistor formed according to the method of FIG. 7.

Next, a second conductivity type dopant can be implanted into the active region 110 of the semiconductor layer 104 on opposing sides of the gate structure 150 and, thereby on opposing sides of the designated channel region 111 to form source/drain extension regions 112 (712, see FIG. 12). For example, for a high-voltage FET, multiple heavily tilted dopant implantation processes can be performed to form relatively deep source/drain extension regions. Such heavily tilted dopant implantation processes can be performed using the dummy gate structure(s) 125, 135 as blocks to prevent implantation of the second conductivity type dopant into the body contact region(s). It should be understood the size (i.e., area dimension) of openings 126, 136 in the dummy gate structures 125, 135, as formed at process 710, can be varied (e.g., between 0.01 $\mu m^2$ and 0.25 $\mu m^2$) as a function of both the tilt angle required for dopant implantation at process 712 and the height of the gate stack in order to achieve the necessary blocking. Other factors that are also consider when determining the size of the openings 126, 136 may include, but are not limited to, foundry ground rules (e.g., ground rules for contacts, such as contact-to-polysilicon edge rules). Optionally, either before or after source/drain extension formation, halo regions (not shown) can also be formed in the active region 110 on opposing sides of the channel region 111.

Figure 13A:
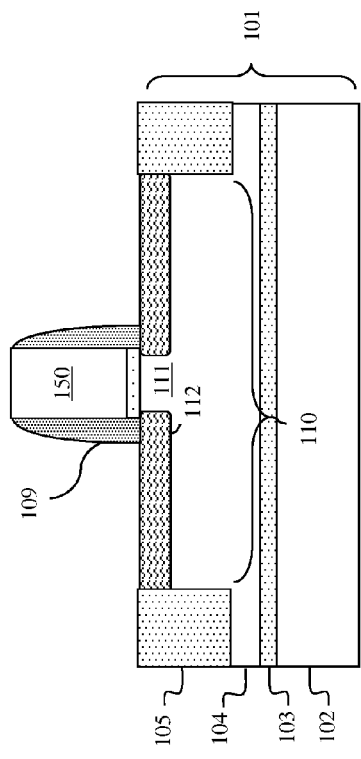
FIG. 13A is a cross-section diagram of a partially completed field effect transistor formed according to the method of FIG. 7.
Figure 13B:
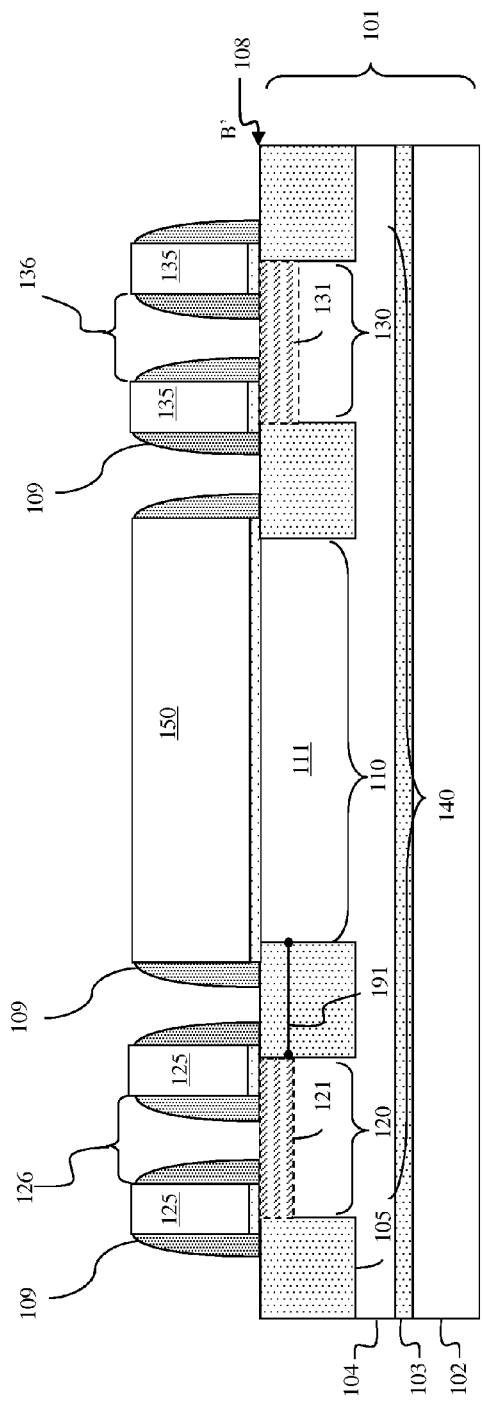
FIG. 13B is another cross-section diagram of the same partially completed field effect transistor shown in FIG. 13A.

Following source/drain extension formation at process 712, dielectric sidewall spacers 109 (e.g., nitride spacers, oxide spacers, oxynitride spacers or other suitable dielectric sidewall spacers) can be formed (e.g., using conventional sidewall spacer formation techniques) on the sidewalls of both the gate structure 150 and the dummy gate structure(s) 125, 135 (714, see FIGS. 13A and 13B). For example, a conformal dielectric layer (e.g., a silicon nitride layer, silicon oxide layer, silicon oxynitride layer, etc.) can be deposited and then directionally etched to form the dielectric sidewall spacers 109 (e.g., nitride spacers, oxide spacers, oxynitride spacers or other suitable dielectric sidewall spacers) on the sidewalls of the gate structure 150 and dummy gate structure(s) 120, 130.

Figure 14:
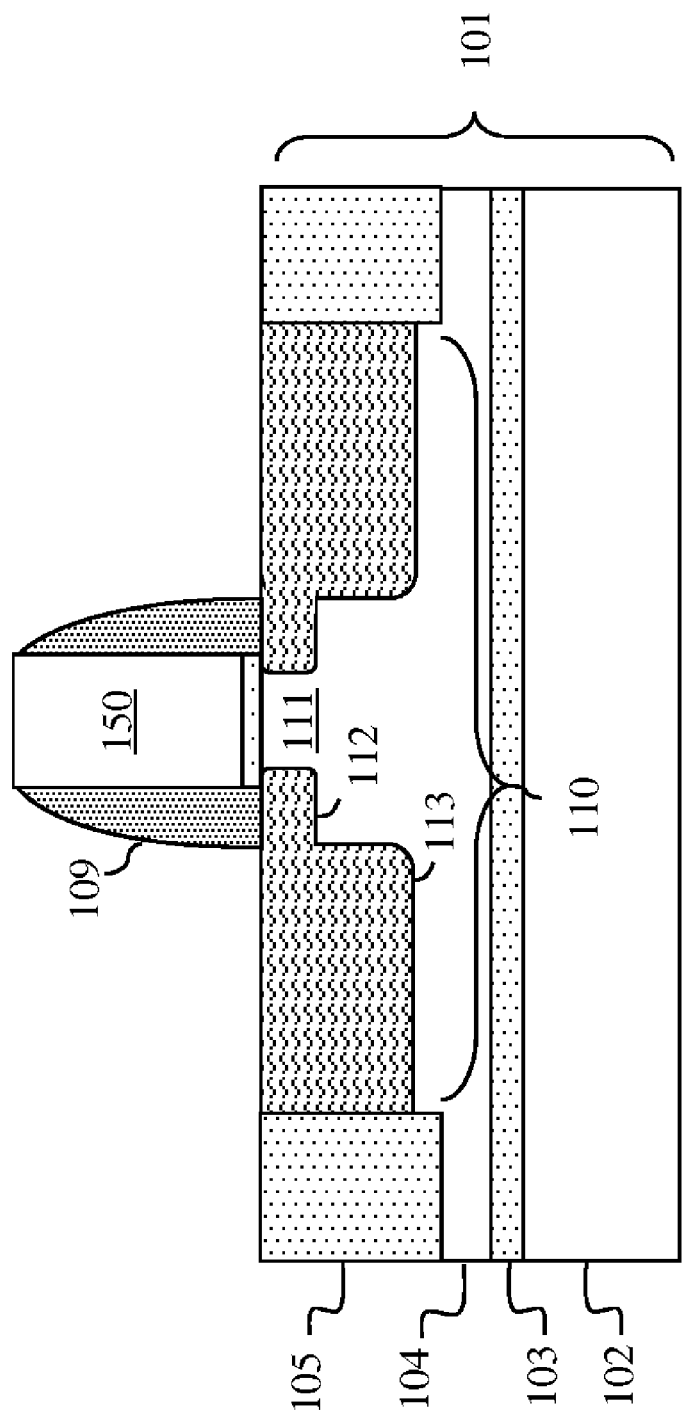
FIG. 14 is a cross-section diagram of a partially completed field effect transistor formed according to the method of FIG. 7.

After the dielectric sidewall spacers 109 are formed at process 714, source/drain regions 113 can be formed within the active region 110 on opposing sides of the gate structure 150 such that the source/drain extension regions 112 are positioned laterally between the source/drain regions 113 and the channel region 111 (716, see FIG. 14). For example, the second conductivity type dopant can be implanted into exposed portions of the active region 110 of the semiconductor layer 104 adjacent to dielectric sidewall spacers 109 on either side of the gate structure 150. This dopant implantation process can similarly be performed using the dummy gate structure(s) 125, 135 as blocks to prevent implantation of the second conductivity type dopant into the body contact region(s) 125, 135.

Optionally, metal silicide layers 106 can then be formed on the top surfaces of the gate structure 150 and dummy gate structure(s) 125, 135 and on any exposed surfaces of the semiconductor layer 104 (718, see FIGS. 1-3). Specifically, a conformal metal layer (e.g., a layer of a refractory or noble metal, such as nickel, cobalt, tungsten, chromium, platinum, titanium, molybdenum, palladium, etc., or an alloy thereof) can be deposited over the structure. Then, an anneal process (e.g., a thermal anneal process) can be performed in order to cause metal atoms from the metal layer to react with the silicon material below (e.g., with silicon in the semiconductor layer 104 and with polysilicon in the gate structure 150 and dummy gate structure(s) 125, 135) in order to create the metal silicide layers 106. It should be noted that, depending upon the size of the openings 126, 136 and, specifically, depending upon whether deposited metal reaches the surface of the semiconductor layer 104 within the openings 126, 136, metal silicide layers 106 may also form on exposed portions of the first and second body contact regions 120, 130. Any excess metal material can then be selectively removed.

Next, one or more layers of dielectric materials 107 (i.e., interlayer dielectrics, such as silicon dioxide, silicon nitride, borophosphosilicate glass (BPSG), etc.) can be deposited, covering the gate structure 150 and dummy gate structure(s) 125, 135 and filling in the remaining portions of the openings 126, 136, which were not previously filled by the dielectric sidewall spacers 109 (720, see FIG. 1). Then, a plurality of contacts 127, 137, 157, 167 for the field effect transistor 100 can be formed (722, see FIGS. 1-3). Specifically, as shown in FIGS. 1 and 3, a first contact 127 (i.e., a first body contact) can be formed that extends vertically through the first opening 126 in the first dummy gate structure 125 to the first body contact region 120 of the semiconductor layer 104. This first contact 127 can be formed such that it is electrically isolated from the first dummy gate structure 120 (e.g., by dielectric materials, such as the dielectric sidewall spacers 109 and/or the dielectric layer(s) 107 within the first opening 126). Additionally, if a second dummy gate structure 135 was formed on a second body contact region at process 710, then a second contact 137 can be formed that extends vertically through the second opening 136 in the second dummy gate structure 135 to the second body contact region 130. Like the first contact 127, this second contact 137 can be formed such that it is electrically isolated from the second dummy gate structure 135 (e.g., by dielectric materials, such as the dielectric sidewall spacers 109 and/or the dielectric layer(s) 107 within the second opening 136). As mentioned above, optional dopant implant regions 121, 131 can be formed at process 706 at the top surface 108 of the semiconductor layer 104 in the body contact regions 120, 130 and such dopant implant regions 121, 131 can enhance the electrical connection between the body contacts 127, 137 and the body region 140.

In addition to the contacts 127, 137, described above, other contacts for the FET 100 can also be formed at process 722. For example, a gate contact 157 can be formed that extends vertically through the dielectric layer(s) 107 to the gate structure 150, as shown in FIG. 1, and source/drain contacts 167 can be formed that extend vertically through the dielectric layer(s) to the source/drain regions 113, as shown in FIG. 2. It should be understood that the term "dummy gate structure" as used in the specification refers to a structure that resembles a gate structure but is non-functioning. That is, the dummy gate structure(s) 125 and 135 have essentially the same components (e.g., a gate dielectric layer and a gate conductor layer) as the gate structure 150 but do not function as gates. Thus, contacts are not formed to these structures 125 and 135 at process 722.

The contacts 127, 137, 157 and 167, as described above, can each be formed using conventional contact formation techniques. For example, openings for these contacts can be lithographically patterned and etched at the required locations through the dielectric layer(s) 107 and within the openings 126, 136 also through the dielectric spacers 109. These openings can be lined with one or more protective liners (e.g., titanium, titanium nitride, etc.) and filled with a conductor (e.g., tungsten).

Figure 15:
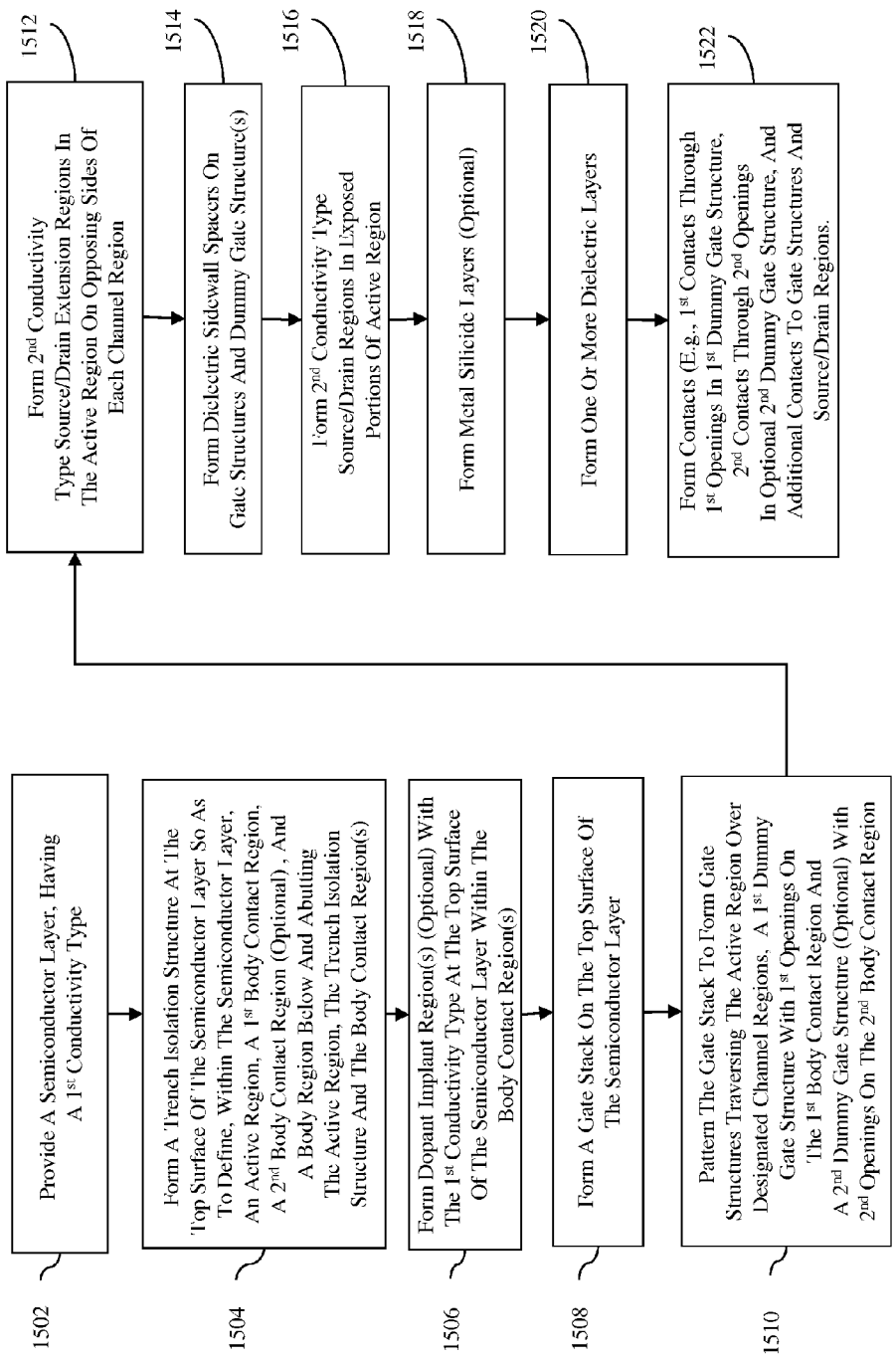
FIG. 15 is a flow diagram illustrating an embodiment of a method of forming the integrated circuit structure of FIGS. 4-6.
Figure 16A:
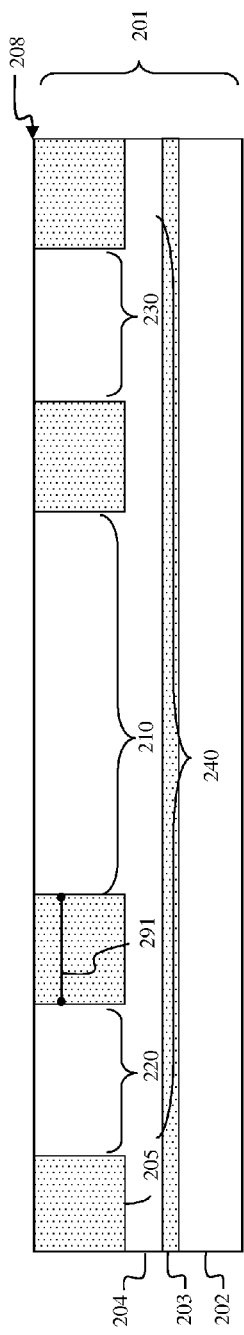
FIG. 16A is a cross-section diagram of a partially completed field effect transistor formed according to the method of FIG. 15.

Referring to FIG. 15, also disclosed herein are embodiments of a method of forming an integrated circuit 400 having a plurality of stacked field effect transistors (FET) 200a-c, as shown in FIGS. 4-6 and described in detail above. The method embodiments can comprise providing a semiconductor layer 204, having a first conductivity type (1502). Specifically, as shown in FIG. 16A, this semiconductor layer 204 can comprise a semiconductor layer of a semiconductor-on-insulator (SOI) wafer 201. Such an SOI wafer can comprise a semiconductor substrate 202 (e.g., a silicon substrate or other semiconductor substrate), an insulator layer 203 (e.g., a silicon oxide layer or other suitable insulator layer) on the substrate 202 and a semiconductor layer 204 (e.g., a single crystalline silicon layer or other suitable semiconductor layer) on the insulator layer 202. However, it should be understood that, alternatively, the semiconductor layer 104 can comprise a bulk semiconductor substrate (e.g., a single crystalline silicon substrate) (not shown).

Figure 16B:
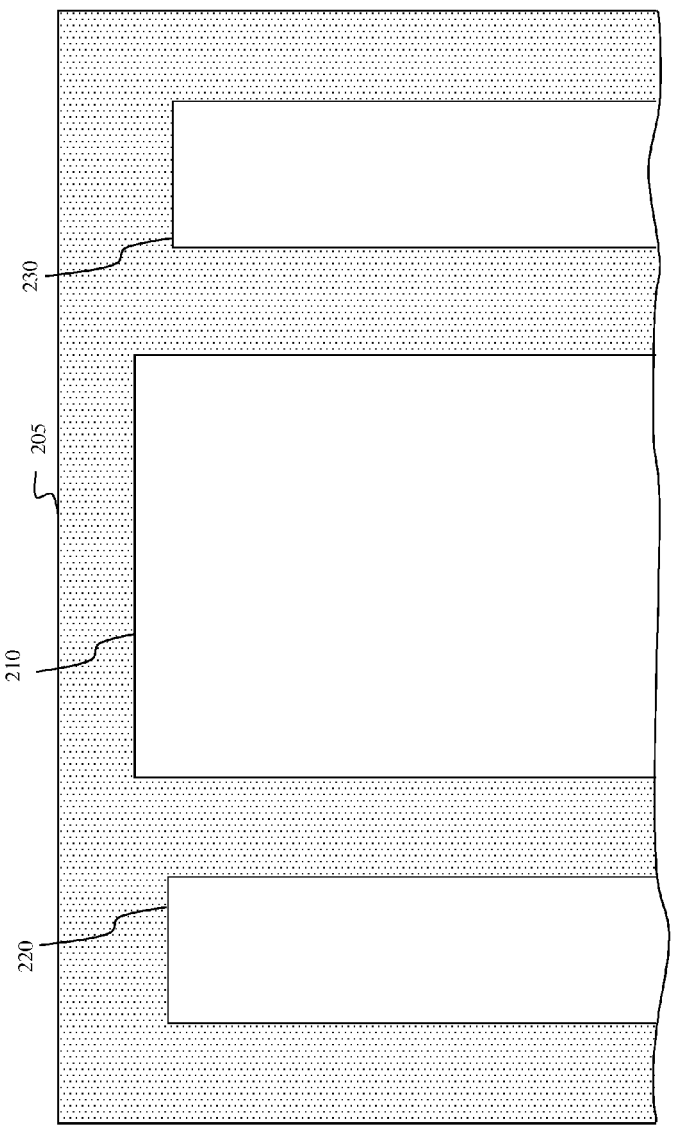
FIG. 16B is a top view diagram of the same partially completed field effect transistor shown in FIG. 16A.

Next, a trench isolation structure 205 can be formed at the top surface 208 of the semiconductor layer 204 so as to define, within the semiconductor layer 204, an active region 210 for the stacked FETs, an elongated first body contact region 120 positioned laterally adjacent to (i.e., parallel to) and isolated from the active region 210, and a body region 240 below and abutting the active region 210, the trench isolation structure 205 and the first body contact region 220 (704, see FIGS. 16A-16B). Optionally, the trench isolation structure 205 can also be formed so as to define, within the semiconductor layer 204, an elongated second body contact region 230 such that the active region 210 is positioned laterally between and parallel to the first body contact region 220 and the second body contact region 230 and such that the body region 240 extends below and abuts the second body contact region 230 as well. More specifically, the trench isolation structure 205 can be formed so as to define the shapes and locations of the active region 210 and body contact region(s) 220, 230 such that the distance 291 between them is relatively short (e.g., between 0.25 μm-3.0 μm or greater and, preferably, can be less than 1.0 μm). For illustration purposes, shape of body contact region(s) 220, 230, as defined by the trench isolation structure 105, is shown in FIG. 16B as being essentially rectangular. Alternatively, the shape of the body contact region(s) 220, 230, as defined by the trench isolation structure, could be an oval or any other suitable elongated shape.

Such a trench isolation structure 205 can be formed at process 1504 using conventional shallow trench isolation (STI) formation techniques. For example, a trench can be lithographically patterned and etched into the semiconductor layer 204 so as to define the shapes and locations of the active region 210 and body contact region(s) 220, 230, as described above, and so that the depth of the trench does not extend vertically completely through the body region 240 (i.e., so that the bottom surface of the trench is above and physically separated from the bottom surface of semiconductor layer 204). Then, to complete the trench isolation structure 205, the trench can be filled with one or more isolation materials (e.g., a silicon oxide, silicon nitride, silicon oxynitride, etc.).

Optionally, after the trench isolation structure 205 is formed at process 1504, the active region 210 can be masked and a first dopant implant region 221 can be formed at the top surface 208 of the semiconductor layer 204 within the first body contact region 220 (1506, see FIGS. 17A-17B). If a second body contact region 230 was also defined in the semiconductor layer 204, a second dopant implant region 231 can essentially simultaneously be formed at the top surface 208 of the semiconductor layer 204 within the second body contact region 230. These dopant implant regions 221, 231 can be formed using conventional dopant implantation techniques in order to achieve a higher concentration of the first conductivity type dopant in the dopant implant regions 221, 231 than in the body region 240 of the semiconductor layer 204.

Figure 18:
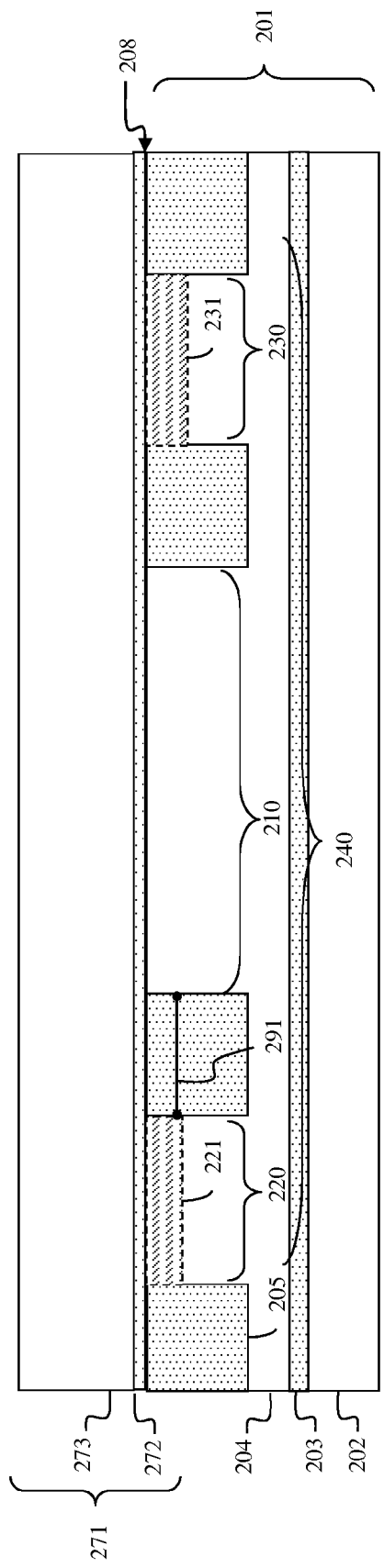
FIG. 18 is a cross-section diagram of a partially completed field effect transistor formed according to the method of FIG. 15.

Next, a gate stack 271 can be formed on the top surface 208 of the semiconductor layer 204 (1508, see FIG. 18). Specifically, a gate dielectric layer 272 can be formed (e.g., deposited) over the active region 210, body contact region(s) 220, 230 and the trench isolation structure 205. Then, a gate conductor layer 273 can be formed on the gate dielectric layer 273. Preferably, this gate conductor layer 273 can comprise a polysilicon gate conductor layer. However, alternatively, it could comprise any other suitable gate conductor layer (e.g., a metal gate conductor layer or a dual work function gate conductor layer).

Figure 19A:
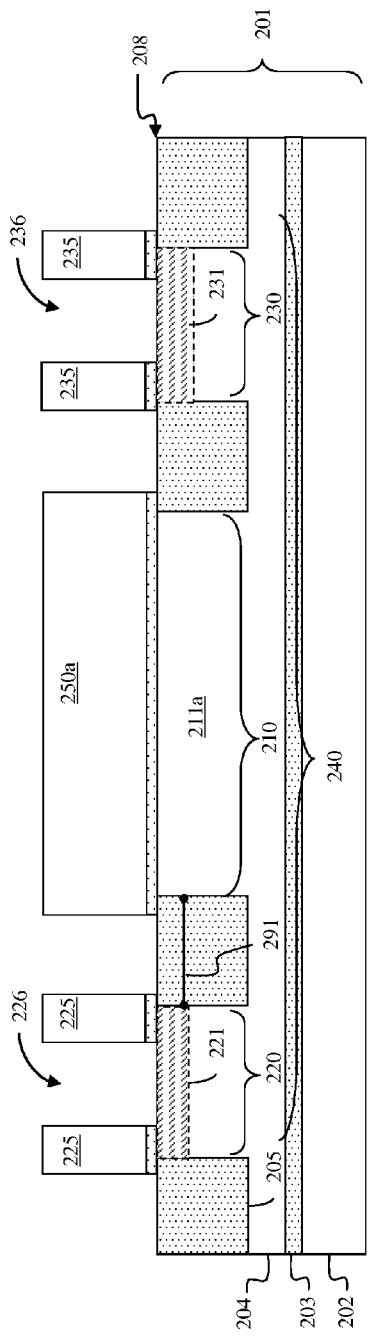
FIG. 19A is a cross-section diagram of a partially completed field effect transistor formed according to the method of FIG. 15.
Figure 19B:
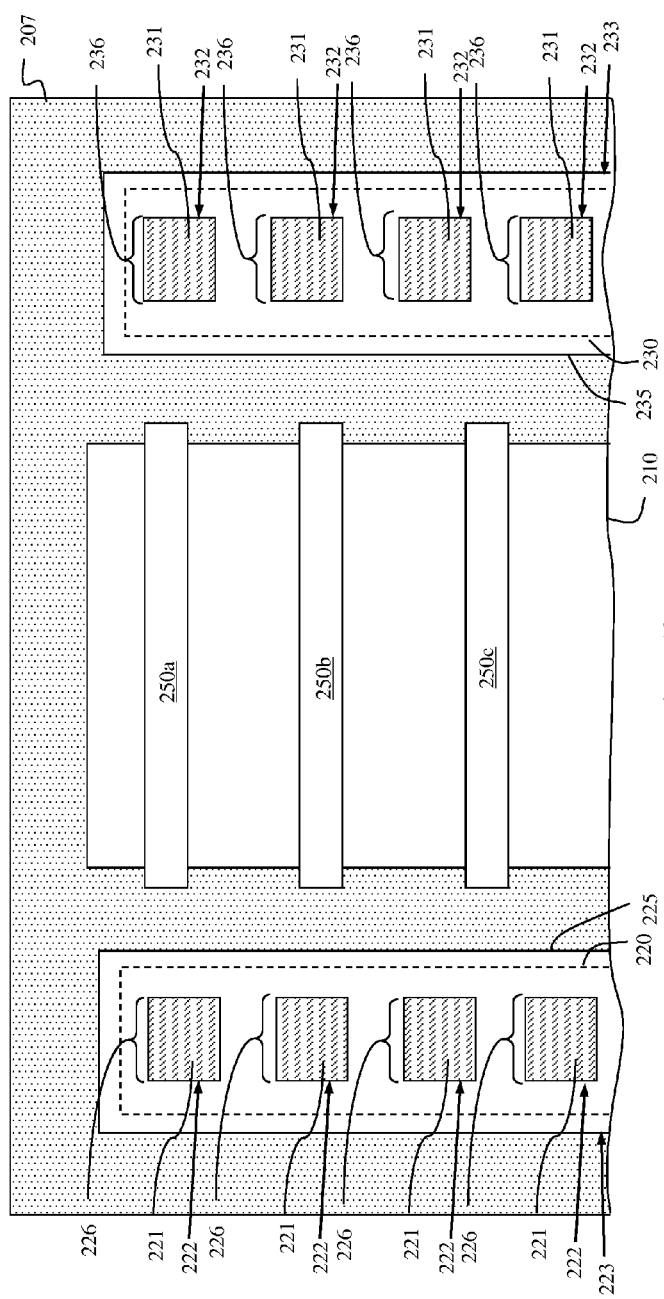
FIG. 19B is a top view diagram of the same partially completed field effect transistor shown in FIG. 19A.

Once the gate stack 271 is formed, it can be patterned to form a plurality of gate structures 150a-c and one or more dummy gate structures 225, 235 (1510, see FIGS. 19A-19B). Specifically, the gate stack 271 can be patterned (e.g., using conventional lithographic patterning and etch techniques) to form gate structures 250a-c traversing the active region 210 above designated channel regions. For illustration purposes gate structures 250a-c for three stacked FETs are shown. However, it should be understood that any number of two or more stacked FETs could be incorporated into the integrated circuit structure 400 (e.g., 6, 8 or 13 stacked FETs may be required for a radio frequency (RF) switch, RF power amplifier, et al, depending upon the voltage rating of the FETs). The gate stack 271 can further be patterned to form a first dummy gate structure 225 on the first body contact region 220 and having a plurality of first openings 226 that extend vertically through the center of the first dummy gate structure 225 to the first body contact region 220 below and that are oriented in a line that runs the length of the first dummy gate structure 225 (i.e., in a line that is parallel to the active region 210). The gate stack 271 can further be patterned so that, except for these first openings 226, the first dummy gate structure 225 covers the entire first body contact region 220 and, optionally, overlaps the interface with the trench isolation structure 205. In this case, the resulting first dummy gate structure 225 will have inner sidewalls 222 within the openings 226 aligned above the first body contact region 220 and outer sidewalls 223 aligned above the trench isolation structure 205.

Additionally, if a second body contact region 230 is defined in the semiconductor layer 204, the gate stack 271 can further be patterned to form a second dummy gate structure 235 on the second body contact region 230 and having a plurality of second openings 236 that extend vertically through the center of the second dummy gate structure 235 to the second body contact region 230 below and that are oriented in a line that runs the length of the second dummy gate structure 235 (i.e., in a line that is parallel to the active region 210). The gate stack 271 can further be patterned so that, except for these second openings 236, the second dummy gate structure 235 covers the entire second body contact region 230 and, optionally, overlaps the interface with the trench isolation structure 205. In this case, the resulting second dummy gate structure 235 will have inner sidewalls 232 within the openings 236 aligned above the second body contact region 230 and outer sidewalls 233 aligned above the trench isolation structure 205.

Figure 20:
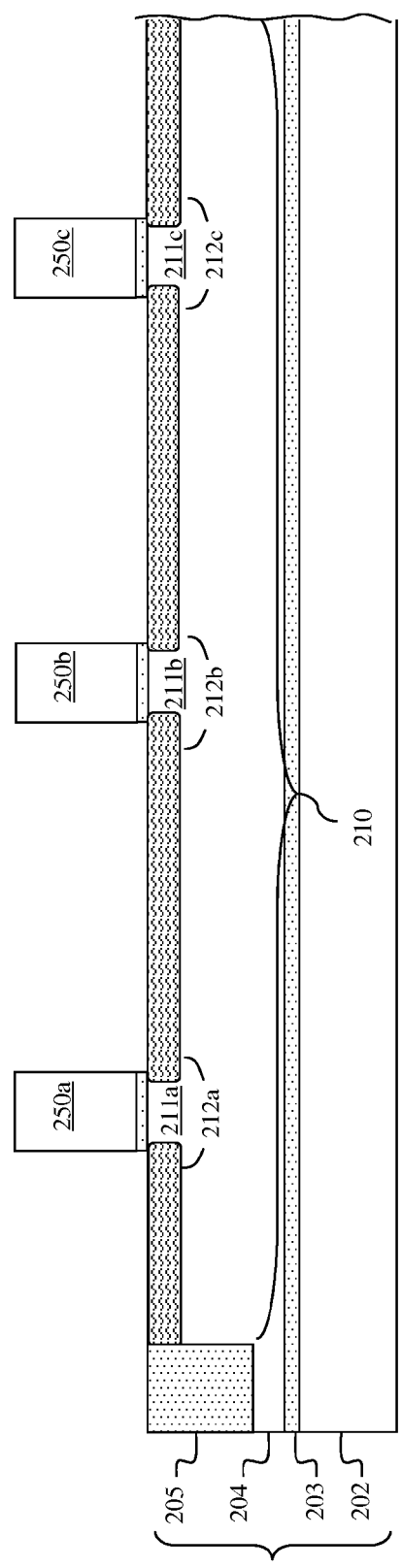
FIG. 20 is a cross-section diagram of a partially completed field effect transistor formed according to the method of FIG. 15.

Next, a second conductivity type dopant can be implanted into the active region 210 of the semiconductor layer 204 on opposing sides of each of the gate structures 250a-c and, thereby on opposing sides of the designated channel regions to form source/drain extension regions 212a-c for each of the FETs (1512, see FIG. 20). For example, for a high-voltage FET, multiple heavily tilted dopant implantation processes can be performed to form relatively deep source/drain extension regions. Such heavily tilted dopant implantation processes can be performed using the dummy gate structure(s) 225, 235 as blocks to prevent implantation of the second conductivity type dopant into the body contact region(s). It should be understood the size (i.e., area dimension) of openings 226, 236 in the dummy gate structures 225, 235, as formed at process 1510, can be varied (e.g., between 0.01 μm² and 0.25 μm²) as a function of both the tilt angle required for dopant implantation at process 1512 and the height of the gate stack in order to achieve the necessary blocking. Other factors that are also consider when determining the size of the openings 226, 236 may include, but are not limited to, foundry ground rules (e.g., ground rules for contacts, such as contact-to-polysilicon edge rules). Optionally, either before or after source/drain extension formation, halo regions (not shown) can also be formed in the active region 210 on opposing sides of each of the channel regions.

Following source/drain extension formation at process 1512, dielectric sidewall spacers 209 (e.g., nitride spacers, oxide spacers, oxynitride spacers or other suitable dielectric sidewall spacers) can be formed (e.g., using conventional sidewall spacer formation techniques) on the sidewalls of both the gate structures 250 and the dummy gate structure(s) 225, 235 (1514, see FIGS. 4-6). For example, a conformal dielectric layer (e.g., a silicon nitride layer, silicon oxide layer, silicon oxynitride layer, etc.) can be deposited and then directionally etched to form the dielectric sidewall spacers 209 (e.g., nitride spacers, oxide spacers, oxynitride spacers or other suitable dielectric sidewall spacers) on the sidewalls of the gate structures 250a-c and dummy gate structure(s) 225, 235.

After the dielectric sidewall spacers 209 are formed at process 1514, source/drain regions 213a-c can be formed within the active region 210 on opposing sides of each of the gate structures 250a-c such that the source/drain extension regions 212a-c are positioned laterally between the source/drain regions 213a-c and the channel regions 211a-c, respectively (1516, see FIG. 5). For example, the second conductivity type dopant can be implanted into exposed portions of the active region 210 of the semiconductor layer 204 adjacent to dielectric sidewall spacers 209 on either side of the gate structures 250a-c. This dopant implantation process can similarly be performed using the dummy gate structure(s) 225, 235 as blocks to prevent implantation of the second conductivity type dopant into the body contact region(s) 220, 230.

Optionally, metal silicide layers 206 can then be formed on the top surfaces of the gate structures 250a-c and dummy gate structure(s) 225, 235 and on any exposed surfaces of the semiconductor layer 204 (1518, see FIGS. 4-6). Specifically, a conformal metal layer (e.g., a layer of a refractory or noble metal, such as nickel, cobalt, tungsten, chromium, platinum, titanium, molybdenum, palladium, etc., or an alloy thereof) can be deposited over the structure. Then, an anneal process (e.g., a thermal anneal process) can be performed in order to cause metal atoms from the metal layer to react with the silicon material below (e.g., with silicon in the semiconductor layer 204 and with polysilicon in the gate structures 250a-c and dummy gate structure(s) 225, 235) in order to create the metal silicide layers 206. It should be noted that, depending upon the size of the openings 226, 236 and, specifically, depending upon whether deposited metal reaches the surface of the semiconductor layer 204 within the openings 226, 236, metal silicide layers 206 may also form on exposed portions of the first and second body contact regions 220, 230. Any excess metal material can then be selectively removed.

Next, one or more layers of dielectric materials 207 (i.e., interlayer dielectrics, such as silicon dioxide, silicon nitride, borophosphosilicate glass (BPSG), etc.) can be deposited, covering the gate structures 250a-c and dummy gate structure(s) 225, 235 and filling in the remaining portions of the openings 226, 236, which were not previously filled by the dielectric sidewall spacers 209 (1520, see FIG. 4). Then, a plurality of contacts 227, 237, 257, 267 for the field effect transistors 200a-c can be formed (1522, see FIGS. 4-6). Specifically, as shown in FIGS. 4 and 6, first contacts 227 (i.e., first body contacts) can be formed that extend vertically through the first openings 226 in the first dummy gate structure 225 to the first body contact region 220 of the semiconductor layer 204. These first contacts 227 can be formed such that they are electrically isolated from the first dummy gate structure 220 (e.g., by dielectric materials, such as the dielectric sidewall spacers 209 and/or the dielectric layer(s) 207 within the first openings 226). Additionally, if a second dummy gate structure 235 was formed on a second body contact region 230 at process 1510, then second contacts 237 can be formed that extend vertically through the second openings 236 in the second dummy gate structure 235 to the second body contact region 230. Like the first contacts 227, these second contacts 237 can be formed such that they are electrically isolated from the second dummy gate structure 235 (e.g., by dielectric materials, such as the dielectric sidewall spacers 209 and/or the dielectric layer(s) 207 within the second openings 236). As mentioned above, optional dopant implant regions 221, 231 can be formed at process 1506 at the top surface 108 of the semiconductor layer 104 in the body contact regions 120, 130 and such dopant implant regions 121, 131 can enhance the electrical connection between the body contacts 227, 237 and the body region 240.

In addition to the contacts 227, 237, described above, other contacts for the FETs 200a-c can also be formed at process 1522. For example, gate contacts can be formed that extend vertically through the dielectric layer(s) 207 to the gate structures (e.g., see gate contact 257 in FIG. 4), and source/drain contacts 267 can be formed that extend vertically through the dielectric layer(s) to the source/drain regions 213a-c, as shown in FIG. 5. Those skilled in the art will recognize that adjacent source/drain regions (e.g., source/drain regions 213a and 213b, source/drain regions 213b and 213c, etc.) can share contacts (as shown) or be discretely contacted. It should further be understood that the term "dummy gate structure" as used in the specification refers to a structure that resembles a gate structure but is non-functioning. That is, the dummy gate structure(s) 225 and 235 have essentially the same components (e.g., a gate dielectric layer and a gate conductor layer) as the gate structures 250a-c but do not function as gates. Thus, contacts are not formed to these structures 225 and 235 at process 1522.

The contacts 227, 237, 257 and 267, as described above, can each be formed using conventional contact formation techniques. For example, openings for these contacts can be lithographically patterned and etched at the required locations through the dielectric layer(s) 207 and within the openings 226, 236 also through the dielectric spacers 209. These openings can be lined with one or more protective liners (e.g., titanium, titanium nitride, etc.) and filled with a conductor (e.g., tungsten).

The method embodiments as described can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of a field effect transistor (FET) structure, in which ohmic body contact(s) are placed relatively close to (e.g., within 1.00 μm of) the active region of the FET. The FET can comprise a semiconductor layer, in which an active region and body contact region(s) are defined by a trench isolation structure and in which a body region is below and abuts the active region, the trench isolation structure and the body contact region(s). A gate structure can traverse the active region. Additionally, dummy gate structure(s) can be positioned on the body contact region(s). A contact can extend through each dummy gate structure to the body contact region below. Dielectric material (e.g., dielectric sidewall spacers and/or interlayer dielectric material) can electrically isolate the contact(s) from the dummy gate structure(s). During processing, the dummy gate structure(s) can act as blocks to ensure that the body contact region(s) of the FET are not implanted with source/drain dopants or, more particularly, not implanted with source/drain extension dopants and, thereby to ensure that the body contact(s), as formed, are ohmic. By allowing the dummy gate structure(s) to act as blocks, such ohmic body contacts can be placed relatively close to the active region of the device and provide significant savings in terms of wafer surface area. Also disclosed herein are embodiments an integrated circuit structure with stacked FETs having such ohmic body contacts and associated method embodiments.

What is claimed is:

1. A field effect transistor comprising:
   a semiconductor layer comprising an active region, a first body contact region positioned laterally adjacent to said active region and a body region below and abutting said active region and said first body contact region;
   a trench isolation structure at a top surface of said semiconductor layer isolating said active region from said first body contact region;
   a gate structure traversing said active region;
   a first dummy gate structure on said first body contact region; and
   a first contact extending vertically through a first opening in said first dummy gate structure to said first body contact region, said first contact being electrically isolated from said first dummy gate structure.

2. The field effect transistor of claim 1,
   said semiconductor layer further comprising a second body contact region,
   said body region being below and abutting said second body contact region,
   said trench isolation structure further isolating said second body contact region from said active region and said first body contact region,
   said active region being positioned laterally between said first body contact region and said second body contact region, and
   said field effect transistor further comprising:
     a second dummy gate structure on said second body contact region; and
     a second contact extending vertically through a second opening in said second dummy gate structure to said second body contact region, said second contact being electrically isolated from said second dummy gate structure.

3. The field effect transistor of claim 1, further comprising:
   a channel region in said active region below said gate structure; and
   source/drain regions in said active region on opposing sides of said channel region,
   said body region, said first body contact region and said channel region having a first conductivity type, and
   said source/drain regions having a second conductivity type different from said first conductivity type.

4. The field effect transistor of claim 3,
   said first body contact region further comprising a dopant implant region at said top surface of said semiconductor layer, and
   said dopant implant region having a higher concentration of a first conductivity type dopant than said body region.

5. The field effect transistor of claim 1, said active region and said first body contact region being separated by less than 1.00 μm.

6. A plurality of stacked field effect transistors comprising:
   a semiconductor layer comprising an active region, a first body contact region positioned laterally adjacent to said active region and a body region below and abutting said active region and said first body contact region;
   a trench isolation structure at a top surface of said semiconductor layer isolating said active region from said first body contact region;
   a plurality of gate structures traversing said active region;
   a first dummy gate structure on said first body contact region; and
   a plurality of first contacts extending vertically through first openings in said first dummy gate structure to said first body contact region, said first contacts being electrically isolated from said first dummy gate structure.

7. The plurality of stacked field effect transistors of claim 6,
said semiconductor layer further comprising a second body contact region,
said body region being below and abutting said second body contact region,
said trench isolation structure further isolating said second body contact region from said active region and said first body contact region,
said active region being positioned laterally between said first body contact region and said second body contact region, and
said field effect transistors further comprising:
    a second dummy gate structure on said second body contact region; and
    a plurality of second contacts extending vertically through second openings in said second dummy gate structure to said second body contact region, said second contacts being electrically isolated from said second dummy gate structure.

8. The plurality of stacked field effect transistors of claim 6, each transistor comprising:
    a channel region in said active region below a corresponding one of said gate structures; and
    source/drain regions in said active region adjacent to opposing sides of said channel region,
    said body region, said first body contact region and said channel region having a first conductivity type, and
    said source/drain regions having a second conductivity type different from said first conductivity type.

9. The plurality of stacked field effect transistors of claim 8,
said first body contact region further comprising a dopant implant region at said top surface of said semiconductor layer, and
said dopant implant region having a higher concentration of a first conductivity type dopant than said body region.

10. The plurality of stacked field effect transistors of claim 6, said active region and said first body contact region being separated by less than 1.00 μm.

* * * * *